US011356079B2

(12) United States Patent
Rochford et al.

(10) Patent No.: US 11,356,079 B2
(45) Date of Patent: Jun. 7, 2022

(54) TUNABLE REACTANCE CIRCUITS FOR WIRELESS POWER SYSTEMS

(71) Applicant: WiTricity Corporation, Watertown, MA (US)

(72) Inventors: Conor Rochford, Newton, MA (US); Bryan Esteban, Watertown, MA (US)

(73) Assignee: WITRICITY CORPORATION, Watertown, MA (US)

( * ) Notice: Subject to any disclaimer, the term of this patent is extended or adjusted under 35 U.S.C. 154(b) by 0 days.

(21) Appl. No.: 17/155,855

(22) Filed: Jan. 22, 2021

(65) Prior Publication Data

US 2021/0234534 A1    Jul. 29, 2021

Related U.S. Application Data

(60) Provisional application No. 62/964,774, filed on Jan. 23, 2020.

(51) Int. Cl.
| | |
|---|---|
| H03B 1/00 | (2006.01) |
| H03K 3/00 | (2006.01) |
| H03H 11/02 | (2006.01) |
| H02J 50/12 | (2016.01) |
| H03K 17/687 | (2006.01) |

(52) U.S. Cl.
CPC ............. *H03H 11/02* (2013.01); *H02J 50/12* (2016.02); *H03K 17/6874* (2013.01)

(58) Field of Classification Search
CPC . H03H 11/02; H02J 50/12; H02J 5/005; H02J 7/025; H03K 17/6874; H02M 3/015
See application file for complete search history.

(56) References Cited

U.S. PATENT DOCUMENTS

| | | | |
|---|---|---|---|
| 5,640,082 | A | 6/1997 | Lusher et al. |
| 5,784,269 | A | 7/1998 | Jacobs et al. |
| 6,483,730 | B2 | 11/2002 | Johnson, Jr. |
| (Continued) | | | |

FOREIGN PATENT DOCUMENTS

| | | |
|---|---|---|
| CN | 103414255 A | 11/2013 |
| EP | 3145047 A1 | 3/2017 |
| (Continued) | | |

OTHER PUBLICATIONS

International Search Report and Written Opinion for PCT/US2021/014621 dated Mar. 23, 2021.

(Continued)

*Primary Examiner* — Metasebia T Retebo
(74) *Attorney, Agent, or Firm* — Goodwin Procter LLP

(57) ABSTRACT

Disclosed herein are tunable reactance circuits configured to present a tunable or variable capacitive reactance when energized. The circuits can include a switch configured to be controlled by a gate driver, the gate driver configured to receive a control signal indicating an on-time of the switch; a diode coupled antiparallel to a switch; and one or more capacitors coupled in parallel to the diode. The tunable capacitive reactance can be based on the on-time of the switch and a total capacitance value of the one or more capacitors. The exemplary tunable reactance circuits may be used in wireless power transmitters and/or receivers for efficient power transmission and/or to deliver a particular level of power to a load.

22 Claims, 18 Drawing Sheets

(56) References Cited

U.S. PATENT DOCUMENTS

| | | | |
|---|---|---|---|
| 7,276,886 | B2 | 10/2007 | Kinder et al. |
| 7,333,349 | B2 | 2/2008 | Chang et al. |
| 7,440,300 | B2 | 10/2008 | Konishi et al. |
| 7,535,133 | B2 | 5/2009 | Perreault et al. |
| 8,830,710 | B2 | 9/2014 | Perreault et al. |
| 10,027,186 | B2 | 7/2018 | Aikawa et al. |
| 10,076,966 | B2 | 9/2018 | Koizumi et al. |
| 10,090,885 | B2 | 10/2018 | Widmer et al. |
| 10,141,788 | B2 * | 11/2018 | Karnstedt ............... H02J 50/12 |
| 10,218,224 | B2 | 2/2019 | Campanella et al. |
| 10,343,535 | B2 | 7/2019 | Cook et al. |
| 10,461,587 | B2 | 10/2019 | Sieber |
| 10,651,688 | B2 | 5/2020 | Karnstedt et al. |
| 10,673,282 | B2 | 6/2020 | Campanella et al. |
| 11,017,942 | B2 | 5/2021 | Rochford et al. |
| 2003/0169027 | A1 | 9/2003 | Croce et al. |
| 2007/0064457 | A1 | 3/2007 | Perreault et al. |
| 2007/0222542 | A1 | 9/2007 | Joannopoulos et al. |
| 2008/0265995 | A1 | 10/2008 | Okamoto et al. |
| 2008/0278264 | A1 | 11/2008 | Karalis et al. |
| 2010/0141042 | A1 | 6/2010 | Kesler et al. |
| 2011/0116290 | A1 | 5/2011 | Boys |
| 2011/0193416 | A1 | 8/2011 | Campanella et al. |
| 2012/0112535 | A1 | 5/2012 | Karalis et al. |
| 2014/0035704 | A1 | 2/2014 | Efe et al. |
| 2014/0049118 | A1 | 2/2014 | Karalis et al. |
| 2014/0152117 | A1 | 6/2014 | Sankar |
| 2014/0361636 | A1 | 12/2014 | Endo et al. |
| 2015/0035372 | A1 | 2/2015 | Aioanei |
| 2015/0051750 | A1 | 2/2015 | Kurs et al. |
| 2015/0061578 | A1 | 3/2015 | Keeling et al. |
| 2015/0202970 | A1 | 7/2015 | Huang et al. |
| 2015/0244179 | A1 | 8/2015 | Ritter et al. |
| 2015/0357826 | A1 | 12/2015 | Yoo et al. |
| 2016/0218566 | A1 | 7/2016 | Bunsen et al. |
| 2016/0248275 | A1 | 8/2016 | Okidan |
| 2016/0254679 | A1 | 9/2016 | Liu et al. |
| 2016/0308393 | A1 | 10/2016 | Kumar et al. |
| 2017/0093168 | A1 | 3/2017 | Von Novak, III et al. |
| 2017/0117751 | A1 | 4/2017 | Karnstedt et al. |
| 2017/0126069 | A1 | 5/2017 | Martin |
| 2017/0217325 | A1 | 8/2017 | DeBaun et al. |
| 2017/0229917 | A1 | 8/2017 | Kurs et al. |
| 2017/0256991 | A1 | 9/2017 | Bronson et al. |
| 2017/0324351 | A1 | 11/2017 | Rochford |
| 2017/0346343 | A1 | 11/2017 | Atasoy et al. |
| 2018/0006566 | A1 | 1/2018 | Bronson et al. |
| 2018/0056800 | A1 | 3/2018 | Meichle |
| 2018/0062421 | A1 | 3/2018 | Danilovic et al. |
| 2018/0236879 | A1 | 8/2018 | Elshaer et al. |
| 2019/0115837 | A1 | 4/2019 | Fahlenkamp et al. |
| 2020/0161901 | A1 | 5/2020 | Tombelli |

FOREIGN PATENT DOCUMENTS

| | | |
|---|---|---|
| EP | 3203634 A1 | 8/2017 |
| EP | 3407467 A1 | 11/2018 |
| GB | 1506633 A | 4/1978 |
| JP | H11-127580 A | 5/1999 |
| JP | 5635215 B1 | 12/2014 |
| KR | 20170118573 A | 10/2017 |
| WO | WO-2015/119511 A1 | 8/2015 |
| WO | WO-2017/070009 | 4/2017 |

OTHER PUBLICATIONS

U.S. Appl. No. 16/671,828 Published as: US2020/0143982 A1, Systems and Methods for Determining Coil Current in Wireless Power Systems, filed Nov. 1, 2019.

U.S. Appl. No. 16/698,317 Published as: US2020/0177028 A1, Systems and Methods for Low Power Excitation in High Power Wireless Power Systems, filed Nov. 27, 2019.

U.S. Appl. No. 17/507,510, Systems and Methods for Low Power Excitation in High Power Wireless Power Systems, filed Oct. 21, 2021.

U.S. Appl. No. 17/556,309, Systems and Methods for Low Power Excitation in High Power Wireless Power Systems, filed Dec. 20, 2021.

U.S. Appl. No. 15/602,775 U.S. Pat. No. 10,804,742 Published as: US2017/0346343 A1, Voltage Regulation in Wireless Power Receivers, filed May 23, 2017.

U.S. Appl. No. 17/039,266 Published as: US2021/0028652, Voltage Regulation in Wireless Power Receivers, filed Sep. 30, 2020.

U.S. Appl. No. 15/685,889 U.S. Pat. No. 10,418,841 Published as: US2018/0062421, Wireless Power Systems Having Interleaved Rectifiers, filed Aug. 24, 2017.

U.S. Appl. No. 16/543,090, Wireless Power Systems Having, filed Aug. 16, 2019.

U.S. Appl. No. 10,707,693 Published as: US2020/0044477, Interleaved Rectifiers.

International Search Report and Written Opinion for PCT/US2017/033997, dated Sep. 12, 2017, 8 pages.

International Search Report and Written Opinion for PCT/US2017/048481 dated Dec. 6, 2017, 9 pages.

International Search Report and Written Opinion for PCT/US2019/059441 dated Feb. 18, 2020, 11 pages.

International Search Report and Written Opinion for PCT/US2019/063616 dated Mar. 11, 2020, 9 pages.

Rivas et al., New Architectures for Radio-Frequency dc/dc Power Conversion, 2004 35th Annual IEEE Power Electronics Specialists Conference, 2004, 11 pages, Aachen, Germany.

Rivas, et al., Design Considerations for Very High Frequency dc-dc Converters, 37th IEEE Power Electronics Specialist Conference, Jun. 18-22, 2006, 11 pages, Jeju, Korea.

* cited by examiner

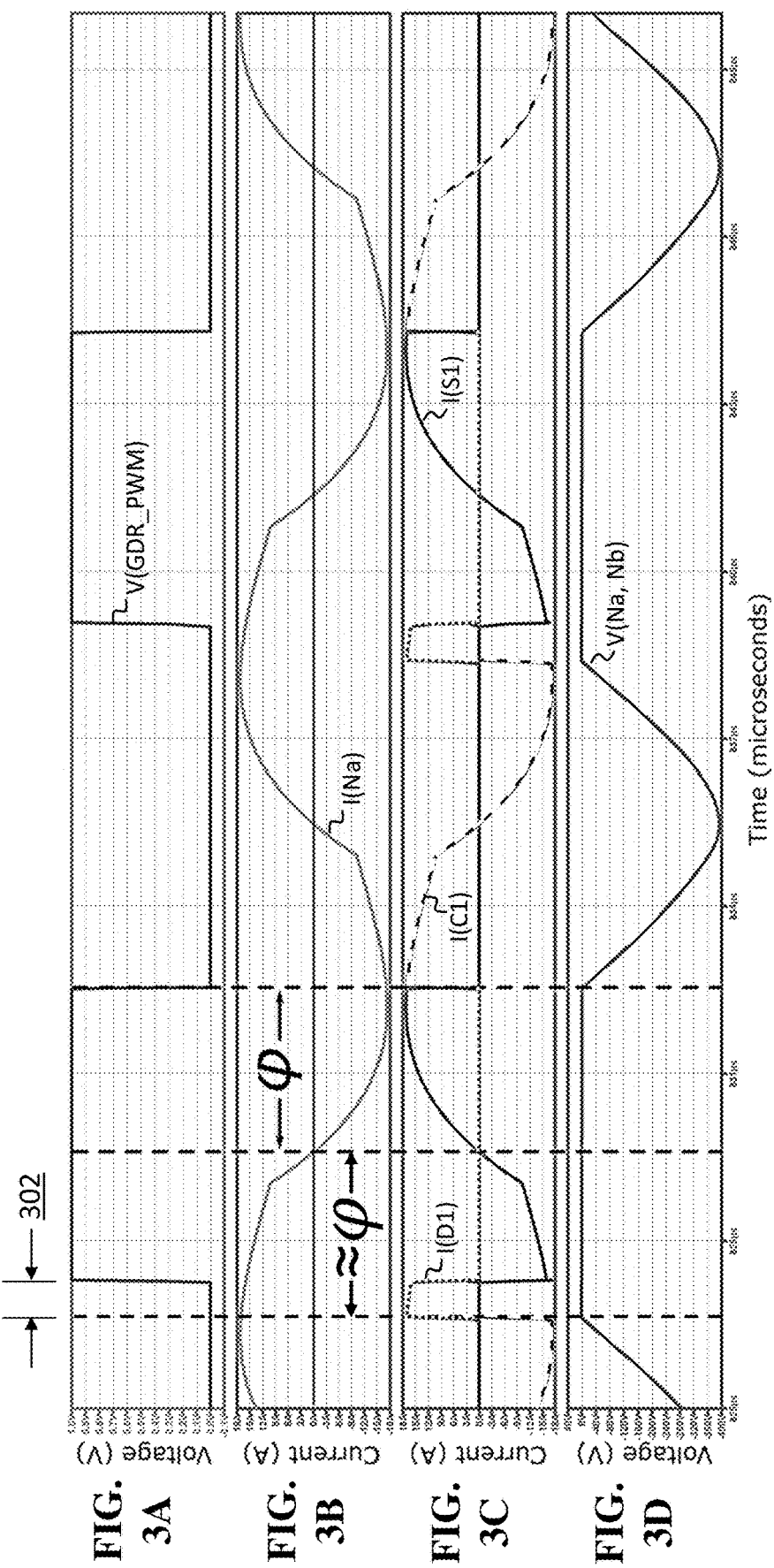

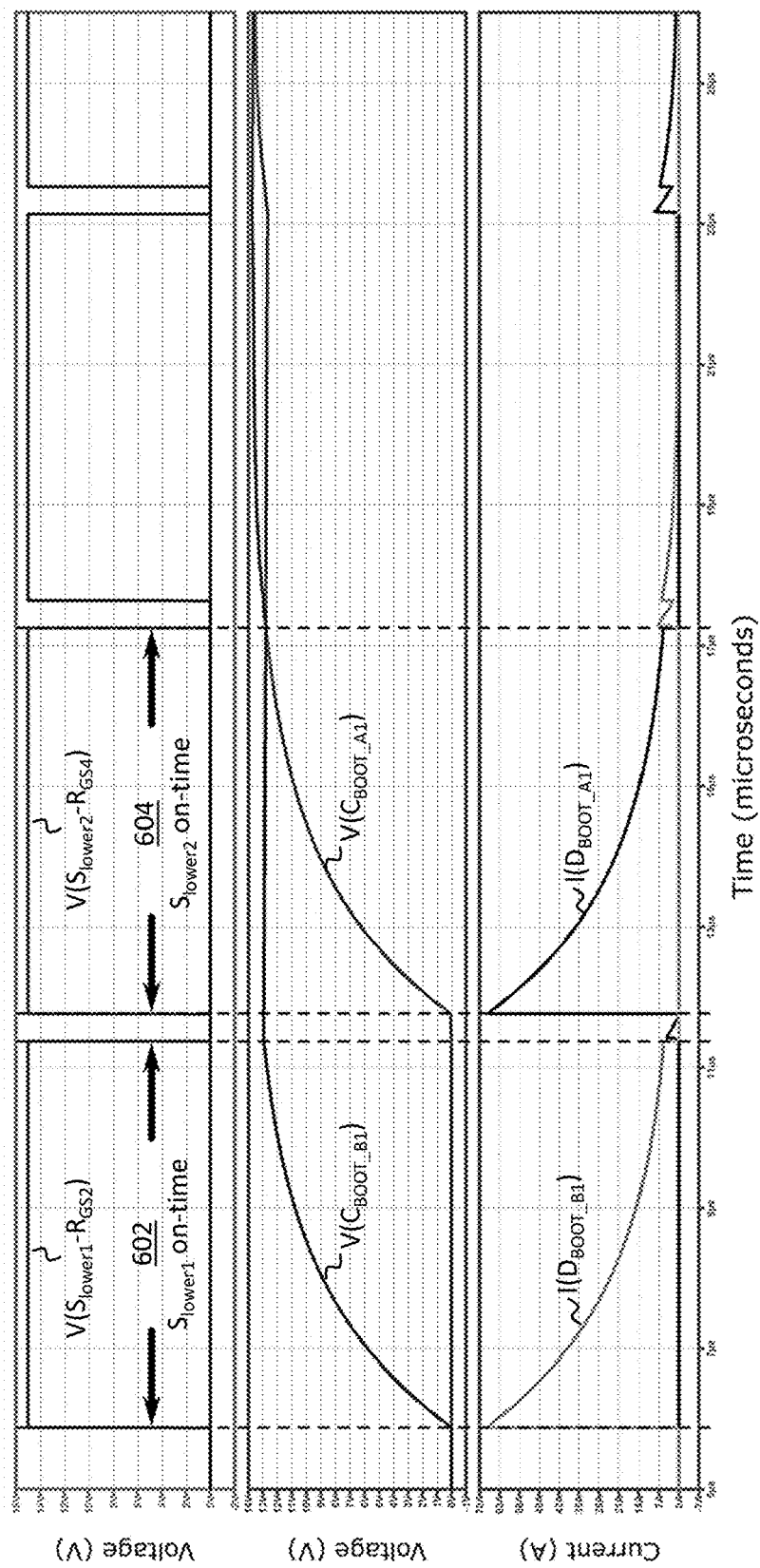

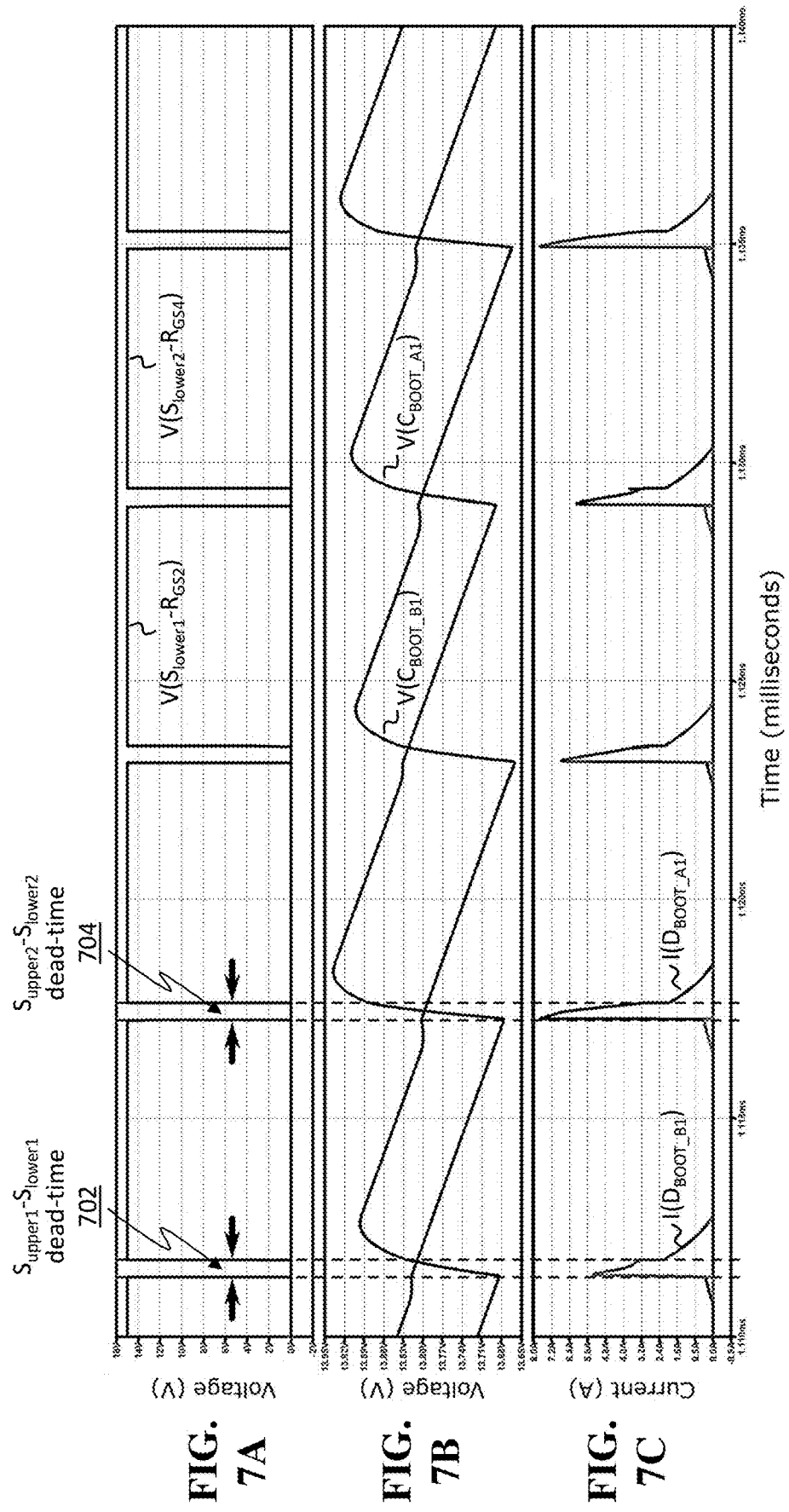

| Transmitter Ref No. | Reactance Circuit | Reactance |
|---|---|---|
| 1002 | No tunable reactance circuit | None or X1 |
| 1004 | Tunable reactance circuit 200 | X2 to X3 |
| 1006 | Tunable reactance circuit 900 | X4 to X5 |

FIG. 10A

| Transmitter Ref No. | Reactance Circuit | Reactance |
|---|---|---|
| 1008 | No tunable reactance circuit | None or X1 |
| 1010 | Tunable reactance circuit 200 | X2 to X3 |
| 1012 | Tunable reactance circuit 900 | X4 to X5 |

FIG. 10B

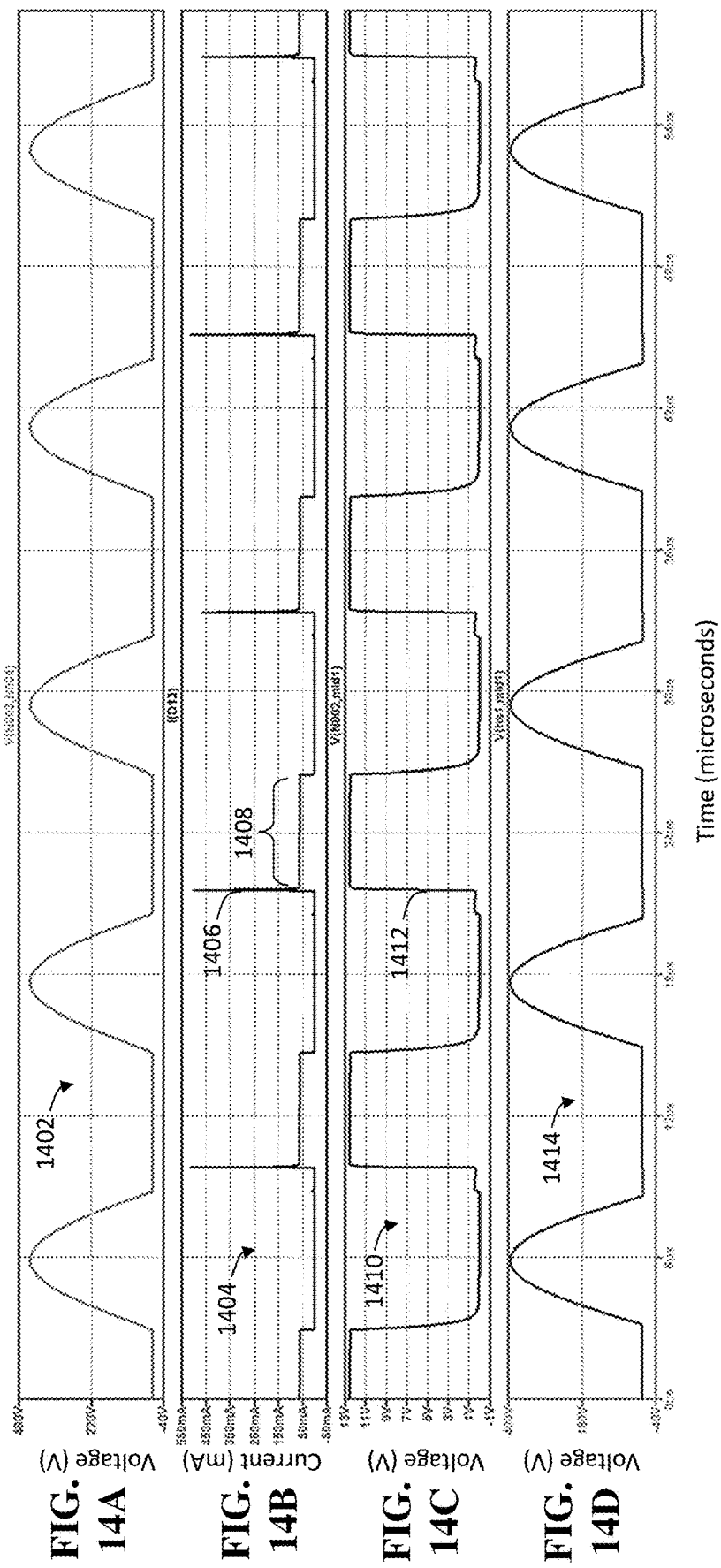

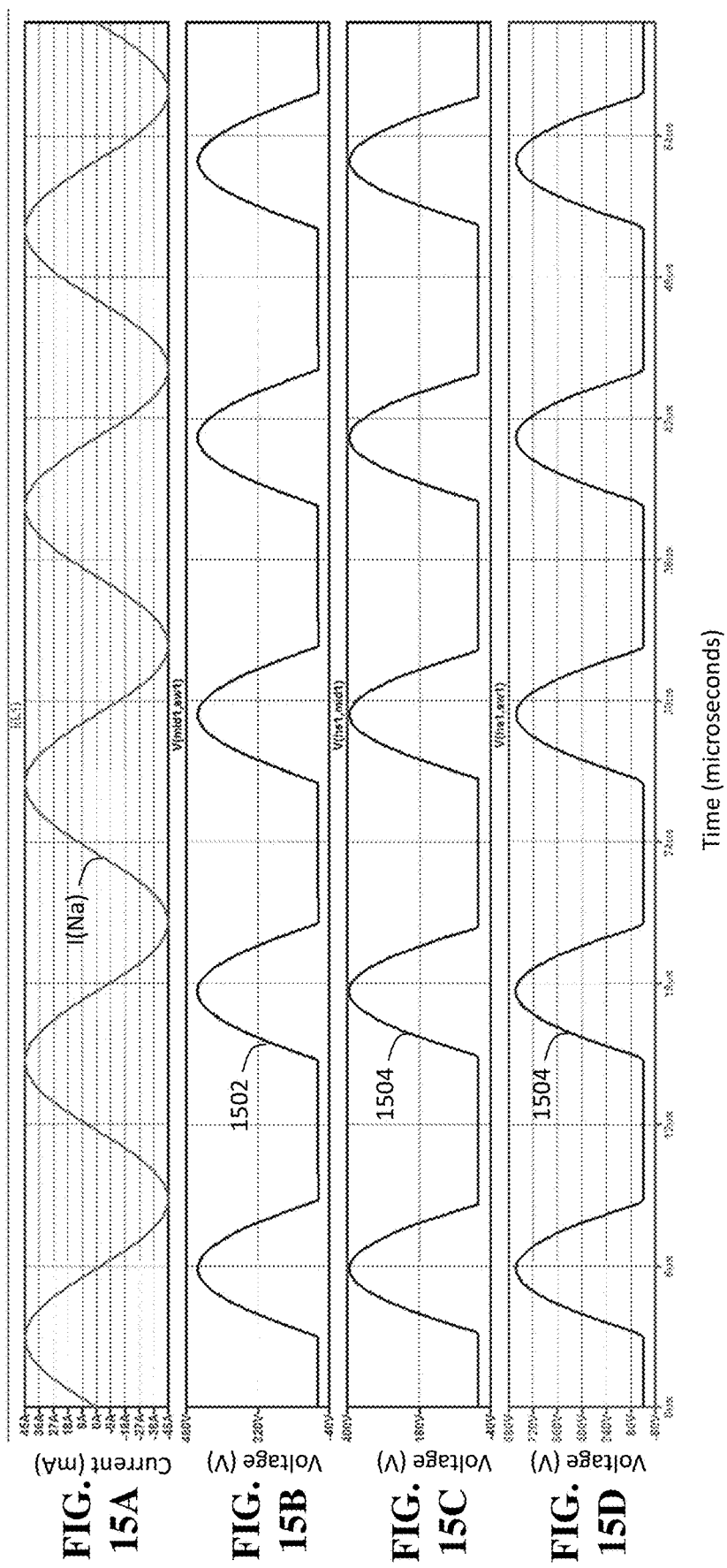

TUNABLE REACTANCE CIRCUITS FOR WIRELESS POWER SYSTEMS

CROSS-REFERENCE TO RELATED APPLICATIONS

This application claims priority to U.S. Provisional Application No. 62/964,774 filed Jan. 23, 2020 and titled "Tunable reactance circuits for wireless power systems," the entirety of which is incorporated herein by reference.

TECHNICAL FIELD

The following disclosure is directed to tunable impedance circuits and, more specifically, tunable reactance circuits for wireless power systems.

BACKGROUND

Wireless power systems can include one or more wireless power transmitters configured to transmit power to one or more wireless power receivers via an oscillating electromagnetic field. Wireless power receivers can be coupled to one or more batteries such that the received power is used to charge the batteries. Wireless power systems can be configured to power various electronic devices (e.g., phones, laptops, medical devices, vehicles, robots, etc.).

SUMMARY

In one aspect, the disclosure features an exemplary tunable reactance circuit configured to present a tunable or variable capacitive reactance when energized. An exemplary tunable reactance circuit can include a switch configured to be controlled by a gate driver, in which the gate driver is configured to receive a control signal indicating an on-time of the switch (e.g., over the period of the driving current); a diode coupled antiparallel to the switch; and one or more capacitors coupled in parallel to the diode, wherein the tunable capacitive reactance can be based on the on-time of the switch and a total capacitance value of the one or more capacitors.

Various embodiments of the exemplary tunable reactance circuit can include one or more of the following features. The tunable reactance circuit is configured to present a tunable capacitive reactance when energized by an alternating current. A capacitance value $C_{eq}$ of the tunable reactance circuit can be defined by:

$$C_{eq} = C_{total} \cdot \frac{2}{2 - (2\varphi - \sin 2\varphi)/\pi}$$

in which $C_{total}$ is the total capacitance value and $\varphi$ is a phase angle. In some embodiments, the phase angle is between 90° and 180°. In some embodiments, the phase angle is between 0° and 180°. The on-time of the switch can be based on the phase angle. The tunable reactance circuit can be configured to present a continuously tunable capacitive reactance between a first capacitive reactance and a second capacitive reactance. The tunable reactance circuit can be configured to present a discretely tunable capacitive reactance between a first capacitive reactance and a second capacitive reactance. The switch can be a metal-oxide semiconductor field-effect transistor (MOSFET).

In another aspect, the disclosure features a system including at least one tunable reactance circuit configured to present a tunable capacitive reactance when energized. The exemplary tunable reactance circuit can include a switch configured to be controlled by a gate driver, in which the gate driver is configured to receive a control signal indicating an on-time of the switch (e.g., over the period of the driving current); a diode coupled antiparallel to the switch; and one or more capacitors coupled in parallel to the diode. The tunable capacitive reactance can be based on the on-time of the switch and a total capacitance value of the one or more capacitors.

Various embodiments of the exemplary system can include one or more of the following features. A capacitance value $C_{eq}$ of the tunable reactance circuit is defined by:

$$C_{eq} = C_{total} \cdot \frac{2}{2 - (2\varphi - \sin 2\varphi)/\pi}$$

wherein $C_{total}$ is the total capacitance value and $\varphi$ is a phase angle (i) between 90° and 180° or (ii) between 0° and 180°, and wherein the on-time of the switch is based on the phase angle. The tunable reactance circuit can be configured to present a continuously or discretely tunable capacitive reactance between a first capacitive reactance and a second capacitive reactance. The switch can be a MOSFET and the diode is a body diode of the MOSFET. The exemplary system can include a driving circuit configured to output a driving signal at an operating frequency, and a resonator configured to generate an electromagnetic field based on the driving signal. The tunable reactance circuit is configured to present a tunable capacitive reactance when energized by an alternating current.

The gate driver can be coupled to a bootstrap power supply, in which the bootstrap power supply can include a bootstrap capacitor configured to charge during conduction of at least a portion of the driving circuit (e.g., low-side switch conduction time). The driving circuit can be an inverter. The transmitter can further include an auxiliary power source configured to energize one or more gate drivers of the inverter and the gate driver of the tunable reactance circuit. The auxiliary power source can be an isolated DC-DC converter. The tunable reactance circuit can be configured to present a capacitive reactance based on a reflected impedance at the transmitter. The tunable reactance circuit can be configured to present a capacitive reactance based on a power characteristic of the transmitter. The transmitter can further include an inductor coupled between the tunable reactance circuit and the resonator.

The tunable reactance circuit can be configured to present a continuously tunable capacitive reactance between a first capacitive reactance and a second capacitive reactance. The tunable reactance circuit can be configured to present a discretely tunable capacitive reactance between a first capacitive reactance and a second capacitive reactance. The switch can be a metal-oxide semiconductor field-effect transistor (MOSFET). The output power from the transmitter can be based on the output reactance of the tunable reactance circuit. The at least one tunable reactance circuit includes a first tunable reactance circuit and a second tunable reactance circuit, and the driving circuit has a second output node coupled to an input of the second tunable reactance circuit and the resonator has a second input node coupled to an output of the second tunable reactance circuit. A capacitance value of the first tunable reactance circuit is equal to a capacitance value of the second tunable reactance circuit.

The system can include a resonator having a first output node coupled to an input of the tunable reactance circuit; and a rectifier coupled to an output of the tunable reactance circuit. The tunable reactance circuit is configured to present a tunable capacitive reactance when energized by an alternating current. The gate driver can be coupled to a bootstrap power supply, in which the bootstrap power supply can include a bootstrap capacitor configured to charge during conduction of at least a portion of the rectifier (e.g., during the low-side diode conduction time). The receiver can include an auxiliary power source configured to energize the gate driver of the tunable reactance circuit. The auxiliary power source can be an isolated DC-DC converter. The tunable reactance circuit can be configured to present a capacitive reactance to modify the reflected impedance of the receiver. The tunable reactance circuit can be configured to present a capacitive reactance based on a power characteristic of the receiver. The receiver can include an inductor coupled between the tunable reactance circuit and the resonator.

The tunable reactance circuit can be configured to present a continuously tunable capacitive reactance between a first capacitive reactance and a second capacitive reactance. The tunable reactance circuit can be configured to present a discretely tunable capacitive reactance between a first capacitive reactance and a second capacitive reactance. The switch can be a metal-oxide semiconductor field-effect transistor (MOSFET). The power delivered to the load can be based on the output reactance of the tunable reactance circuit. The at least one tunable reactance circuit can include a first tunable reactance circuit and a second tunable reactance circuit, and the resonator has a second output node coupled to an input of the second tunable reactance circuit and the rectifier has a second input node coupled to an output of the second tunable reactance circuit. A capacitance value of the first tunable reactance circuit is equal to a capacitance value of the second tunable reactance circuit.

BRIEF DESCRIPTION OF THE DRAWINGS

FIG. 3A is a plot of a voltage signal representing a PWM control signal configured to control the tunable reactance circuit. FIG. 3B is a plot of a current signal representing the current from the inverter into the tunable reactance circuit of an exemplary wireless power transmitter.

FIG. 3C is a plot of (i) a current signal representing the current in the switch of the circuit of FIG. 2; (ii) a current signal representing the current at the capacitor(s) of the circuit of FIG. 2; and (iii) a current signal representing the current in the diode of the circuit of FIG. 2. FIG. 3D is a plot of a voltage signal between nodes of the circuit of FIG. 2.

FIG. 6A is a plot of (i) voltage signal representing the voltage difference between the gate of first lower switch and ground during ramp-up; and (ii) voltage signal representing the voltage difference between the gate of second lower switch and ground during ramp-up. FIG. 6B is a plot of (i) voltage signal across first bootstrap capacitor during ramp-up and (ii) voltage signal across second bootstrap capacitor during ramp-up. FIG. 6C is a plot of (i) current signal through a first bootstrap diode during ramp-up and (ii) current signal through a second bootstrap diode during ramp-up.

FIG. 7A is a plot of (i) voltage signal representing the voltage difference between the gate of first lower switch and ground during steady-state; and (ii) voltage signal representing the voltage difference between the gate of second lower switch and ground during steady-state. FIG. 7B is a plot of (i) voltage signal across first bootstrap capacitor during steady-state and (ii) voltage signal across second bootstrap capacitor during steady-state. FIG. 7C is a plot of (i) current signal through a first bootstrap diode during steady-state and (ii) current signal through a second bootstrap diode during steady-state.

FIGS. 10A-10B are tables illustrating tunable reactance ranges for example wireless power transmitters with or without tunable reactance circuits.

FIGS. 14A-14D are plots of signals in the receiver portion of FIG. 13.

FIGS. 15A-15D are plots of signals in the receiver portion of FIG. 13.

DETAILED DESCRIPTION

Disclosed herein are electronic circuits, systems, and methods directed to providing tunable impedance and, more specifically, tunable reactance. Embodiments of the tunable reactance circuits may be utilized in wireless power systems, including wireless power transmitters and/or receivers for delivering a particular level of power and/or with a particular efficiency to a load, e.g., a battery.

Wireless Power Systems

Figure 1:
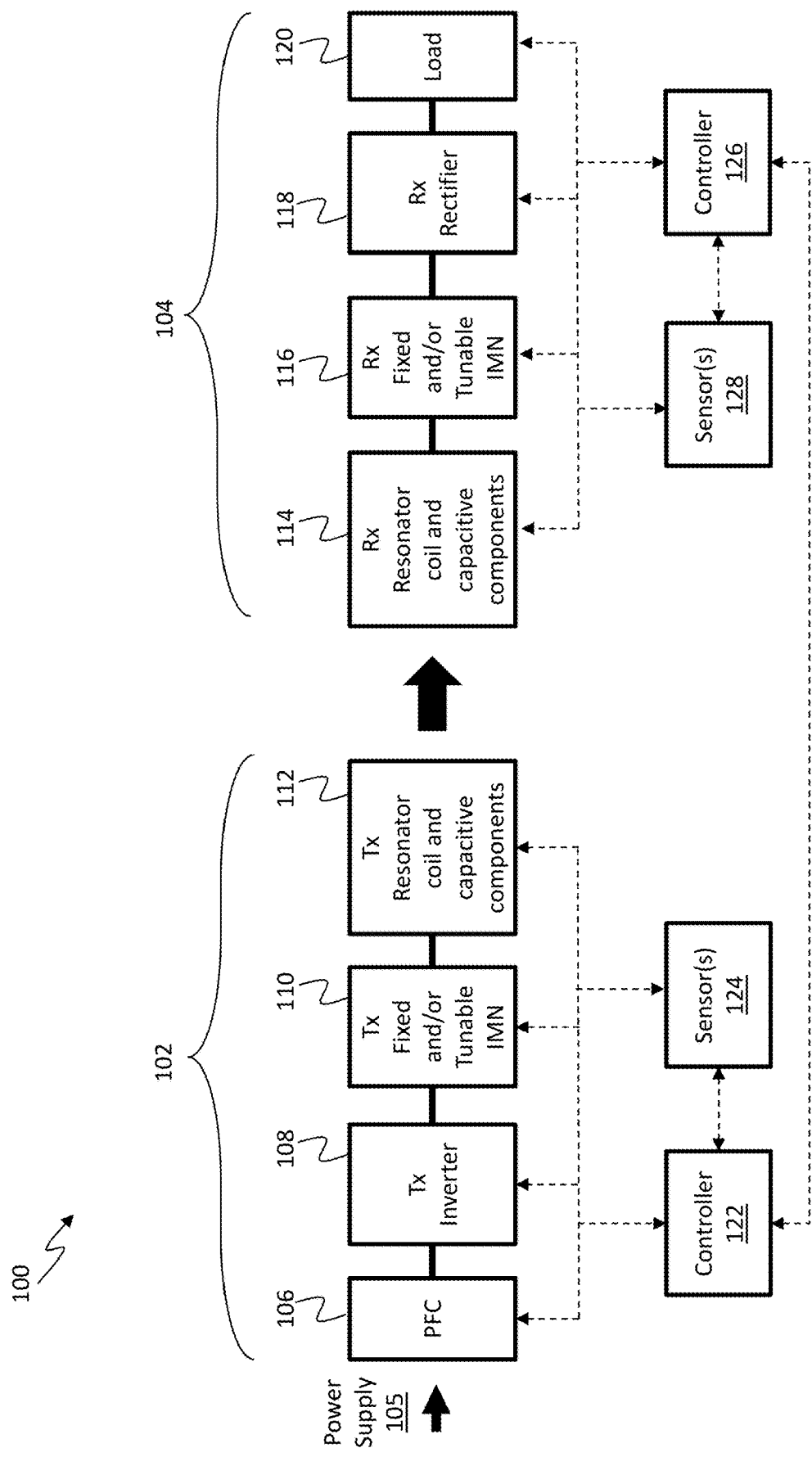
FIG. 1 is a block diagram of an exemplary wireless power system including one or more exemplary tunable reactance circuits described herein.

FIG. 1 is a block diagram of an exemplary wireless power system 100 including one or more exemplary tunable reactance circuits. The system 100 includes a wireless power transmitter 102 and a wireless power receiver 104. In transmitter 102, a power supply 105 (e.g., AC mains, battery, etc.) provides power to an inverter 108. Additional components can include power factor correction (PFC) circuit 106 before the inverter stage 108. The inverter 108 drives the transmitter resonator coil and capacitive components 112

("resonator"), via an impedance matching network 110 (including fixed and/or tunable network components). The transmitter resonator produces an oscillating magnetic field which induces a current and/or voltage in receiver resonator. The received energy is provided to a rectifier 118 via impedance matching network 116 (including fixed and/or tunable network components). Ultimately, the rectified power is provided to a load 120 (e.g., one or more batteries of an electric or hybrid vehicle). In some embodiments, the battery voltage level can impact various parameters (e.g., impedance) of the wireless power system 100. Therefore, the battery voltage level may be received, determined, or measured to be provided as input to other portions of the wireless power system 100. For example, a typical battery voltage range for electric vehicles is 280-420 V.

In some embodiments, one or more components of the transmitter 102 can be coupled to a controller 122, which may include a communication module (e.g., Wi-Fi, radio, Bluetooth, in-band signaling mechanism, etc.) configured to communicate with a communication module of receiver 104. In some embodiments, one or more components of the transmitter 102 can be coupled to one or more sensors 124 (e.g., a current sensor, a voltage sensor, a power sensor, a temperature sensor, a fault sensor, etc.). The controller 122 and sensor(s) 124 can be operably coupled to control portions of the transmitter 102 based on feedback signals from the sensor(s) 124 and/or sensor(s) 128.

In some embodiments, one or more components of the receiver 104 can be coupled to a controller 126, which may include a communication module (e.g., Wi-Fi, radio, Bluetooth, in-band signaling mechanism, etc.) configured to communicate with the communication module of transmitter 102. In some embodiments, one or more components of the transmitter 104 can be coupled to one or more sensors 128 (e.g., a current sensor, a voltage sensor, a power sensor, a temperature sensor, a fault sensor, etc.). The controller 126 and sensor(s) 128 can be operably coupled to control portions of the transmitter 102 based on feedback signals from the sensor(s) 128 and/or sensor(s) 124.

Examples of wireless power systems can be found in U.S. Patent Application Publication No. 2010/0141042, published Jun. 10, 2010 and titled "Wireless energy transfer systems," and U.S. Patent Application Publication No. 2012/0112535, published May 10, 2012 and titled "Wireless energy transfer for vehicles," both of which are hereby incorporated by reference in their entireties.

High-power wireless power transmitters can be configured to transmit wireless power in applications such as powering of and/or charging a battery of vehicles, industrial machines, robots, or electronic devices relying on high power. For the purpose of illustration, the following disclosure focuses on wireless power transmission for vehicles. However, it is understood that any one or more of the embodiments described herein can be applied to other applications in which wireless power can be utilized.

Tunable Impedance Matching Networks

In some embodiments, the exemplary impedance matching networks (IMNs) 110, 116 can include one or more variable impedance components. The one or more variable impedance components may be referred together herein as a "tunable matching network" (TMN). Note that impedance may be expressed in Cartesian form as follows:

$$Z = R + jX$$

where the real part of impedance is resistance R and the imaginary part is reactance X. TMNs can be used in adjusting the impedance (e.g., including the reactance X) of the wireless power transmitter 102 and/or receiver 104.

In some embodiments, tunable matching network(s) may be referred to as "tunable reactance circuit(s)". In some applications, e.g., wireless power transmission, impedances seen by the wireless power transmitter 102 and/or presented by the receiver 104 may vary dynamically. In such applications, impedance matching between a receiver resonator coil (of 114) and a load 120, and between a transmitter resonator coil (of 112) and the power supply 105, may be beneficial to prevent unnecessary energy losses and excess heat. The impedance reflected on or by a resonator coil may be dynamic, in which case, a dynamic impedance matching network can be adjusted to compensate for the varying impedance to improve the performance (e.g., efficiency, power delivery, etc.) of the system 100. In the case of the inverter 108 in a wireless power system 100, the impedances seen by the inverter 108 may be highly variable because of changes in the load 120 receiving power (e.g., battery or battery charging circuitry) and changes in the coupling between the transmitter 102 and receiver 104 (caused, for example, by changes in the relative position of the transmitter and receiver resonator coils). Similarly, the impedance loading the receiver resonator (of 114) may also change dynamically because of changes in the load 120 receiving power. In addition, the desired impedance matching for the receiver resonator (of 114) may be different for different coupling conditions and/or power supply conditions.

Accordingly, power transmission systems transmitting and/or receiving power via highly resonant wireless power transfer, for example, may utilize tunable or variable impedance matching networks 110, 116 to maintain efficient power transmission and/or to deliver a particular level of power to a load 120. For instance, one or more components of a TMN can be configured to present an impedance between a minimum impedance and a maximum impedance attainable by the particular components of the TMN. In various embodiments, the attainable impedance can be dependent on the operating frequency (e.g., 80 kHz to 90 kHz) of the wireless power system 100. Tuning may be performed continuously, intermittently, or at certain points in power transmission (e.g., at the beginning of or during power transmission). Examples of tunable matching networks can be found in U.S. Patent Application Publication No. 2017/0217325, published Aug. 3, 2017 and titled "Controlling wireless power transfer systems", and U.S. Patent Application Publication No. 2017/0229917, published Aug. 10, 2017 and titled "PWM capacitor control", both of which are hereby incorporated by reference in their entireties.

As used herein, the term "capacitor", or the symbol therefor, can refer to one or more electrical components having a capacitance (e.g., in Farads) and/or capacitive reactance (e.g., in Ohms). For example, capacitor can include one or more capacitors (e.g., in a "bank" of capacitors) that may be on the order of tens, hundreds, etc. of discrete capacitors. Two or more capacitors may be coupled in series or parallel to attain the desired capacitance and/or desired capacitive reactance. Note that capacitive reactance may be expressed as a negative value herein. However, one skilled in the art would recognize that, in some conventions, capacitive reactance may also be expressed as a positive value. While the disclosure, including the Figures, may provide exemplary values for the various electrical components, it is understood that the value of the components can be customized for the particular application. For example, the value of various electronic components can depend whether the wireless power transmitter is used to transmit power for charging a vehicle battery (on the order of thousands of Watts) or a cell phone battery (typically less than 5 Watts).

Single-Switch Tunable Reactance Circuit

Figure 2:
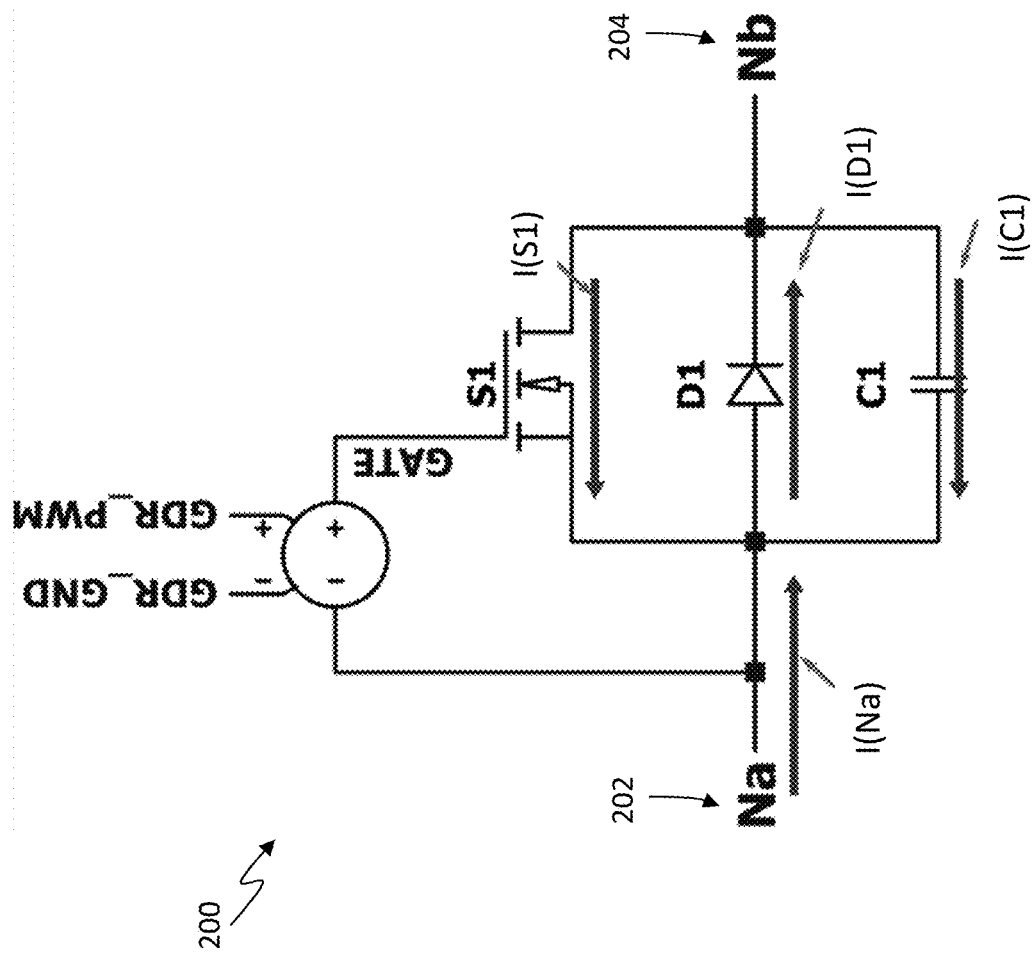
FIG. 2 is a schematic of an exemplary single-switch tunable reactance circuit including one or more capacitors coupled in parallel to a diode.

FIG. 2 illustrates a single-switch tunable reactance circuit 200 including one or more capacitors C1 coupled in parallel to a diode D1. The diode D1 is coupled antiparallel to a switch S1. The switch S1 may be a transistor (e.g., field-effect transistor (FET), metal-oxide semiconductor FET (MOSFET), insulated-gate bipolar transistor (IGBT), bipolar junction transistor (BJT), etc.). If the switch S1 is configured to only carry positive current, a diode D1 is coupled such that it provides a path for current to flow during negative current, as described further below for FIGS. 3A-3D. In some embodiments, the switch may be a MOSFET, which is able to conduct negative current. In the case of a MOSFET, the diode D1 is the body diode of the MOSFET.

The switch S1 can be controlled by a pulse width modulation (PWM) control signal ("GDR_PWM"). The PWM control signal may have a duty cycle of 50% of operating frequency period, where the switching period is defined as the inverse of the operating frequency (e.g., between 80 to 90 kHz) of the wireless power system 100. The switch gating function for switch S1 can be synchronized with the zero crossing of the current into node "Na" 202.

In some embodiments, the switch S1 on-time can be based on an equivalent capacitance desired at a given time in the operation of the wireless power transmitter 102 or receiver 104. The equivalent capacitance $C_{eq}$ can be determined by:

$$C_{eq} = C1 \cdot \frac{2}{2 - (2\varphi - \sin 2\varphi)/\pi}$$

$$90° \le \varphi \le 180° \text{ or } 0° \le \varphi \le 180°$$

in which C1 is the value of the one or more capacitors as discussed above and $\varphi$ is the phase delay between the zero-crossing of the current I(Na) from node Na into the tunable reactance circuit and the turn-off of the switch S1. Accordingly, the switch S1 on-time is be based on the phase delay $\varphi$.

FIG. 3A is a plot of a voltage signal V(GDR_PWM) representing the PWM control signal. FIG. 3B is a plot of a current signal I(Na) representing the current from the inverter 108 into the tunable reactance circuit 200 of the transmitter 102. FIG. 3C is a plot of (i) a current signal I(S1) representing the current in the switch S1; (ii) a current signal I(C1) representing the current at the capacitor(s) C1 (e.g., current measured at a node on a side of the capacitor(s) C1, a calculated current (current I=C*dV/dt), etc.); and (iii) a current signal I(D1) representing the current in the diode D1. FIG. 3D is a plot of a voltage signal V(Na, Nb) between node Na 202 and node Nb 204. As illustrated, phase delay $\varphi$ is the difference between the zero-crossing of current I(Na) and the turn-off of voltage signal V(GDR_PWM). Assuming nearly sinusoidal I(Na) current from node Na into the tunable reactance circuit 200, the phase delay between the turn-on of switch S1 and the zero-crossing of the current I(Na) for node Na into the tunable reactance circuit 200 can be anywhere from 0° to cp. If turn-on to zero-crossing phase delay is equal to $\varphi$, the on-time of the gate drive signal is center-aligned with the zero-crossing. In practice and as illustrated in FIGS. 3A-3D, a turn-on delay 302 is added such that the turn-on to zero crossing phase delay is slightly smaller than $\varphi$ in order to ensure voltage V(Na, Nb) across the switch S1 has reached zero before the switch is turned on and to minimize the diode conduction time. The notation ≈$\varphi$ indicates the range of time the switch S1 (e.g., FET) can turn on. In the example provided in FIGS. 3A-3D, switch S1 (e.g., FET) turns on when current I(D1) coincides with rising and falling to zero of voltage V(GDR_PWM). Note the convention of current flow illustrated in FIG. 2 is applicable in the waveforms of FIGS. 3A-3D.

Figures 4A, 4B:
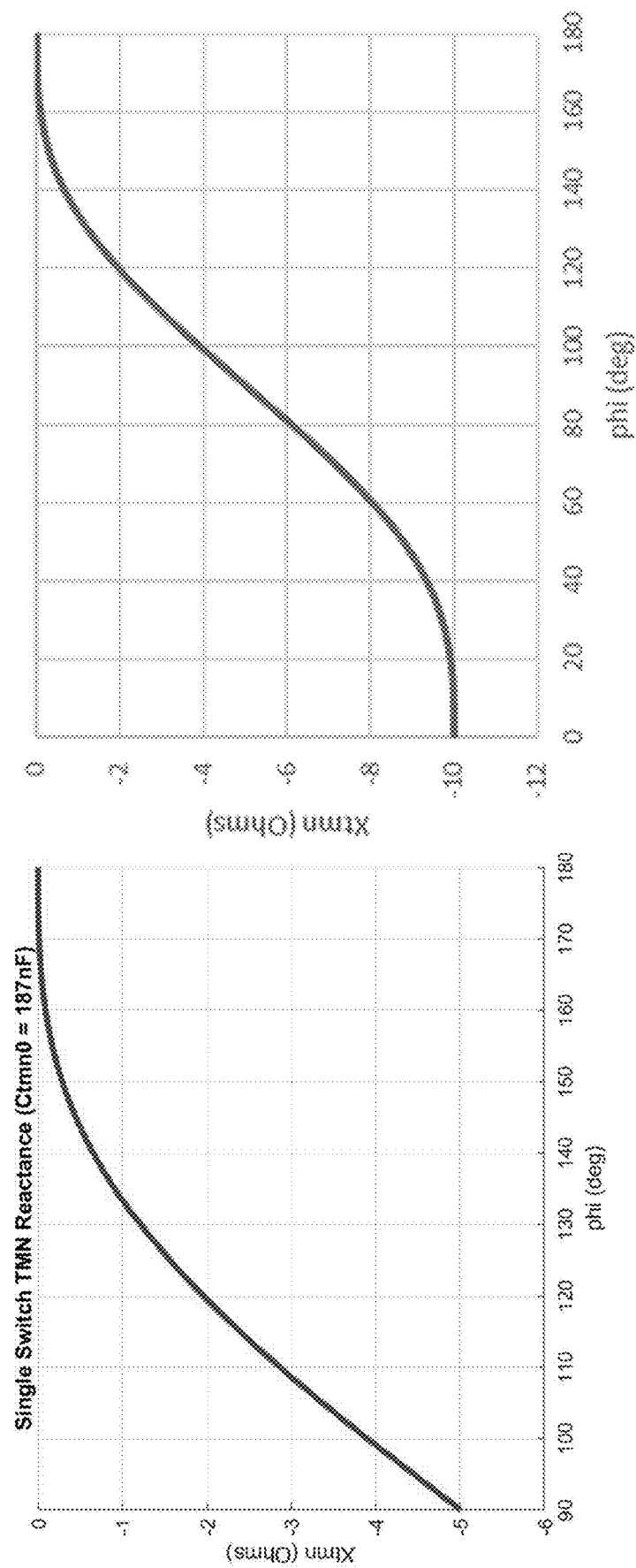
FIGS. 4A-4B are plots of the reactance of the single-switch tunable reactance circuit as a function of phase delay phi (in degrees) as illustrated in FIGS. 3A-3D.

FIG. 4A is a plot of the reactance of the single-switch tunable reactance circuit 200 as a function of phase delay $\varphi$ (degrees), as described above. In particular, for an exemplary capacitance of capacitor(s) C1=187 nF and $\varphi$ between 90° and 180°, the circuit 200 can produce a capacitive reactance of approximately −5 to 0 Ohms at 85 kHz. Referring to FIG. 4B, for an exemplary capacitance of capacitor(s) C1=187 nF and $\varphi$ between 0° and 180°, the circuit 200 can produce a capacitive reactance of approximately −10 to 0 Ohms at 85 kHz. In this example, for a transmitter 102, the capacitance of 187 nF may be attained with a base capacitance value of 10 nF by including two capacitor banks in series in which each bank has 38 parallel capacitors.

In some embodiments, the gate driver of the switch S1 of the single-switch tunable reactance circuit 200 can be powered by a bootstrap circuit that is charged by a supply referenced to ground, as described further below, instead of requiring isolated DC-DC converters for the gate driver.

Single-Switch Tunable Reactance Circuit for Wireless Power Systems

Figure 5A:
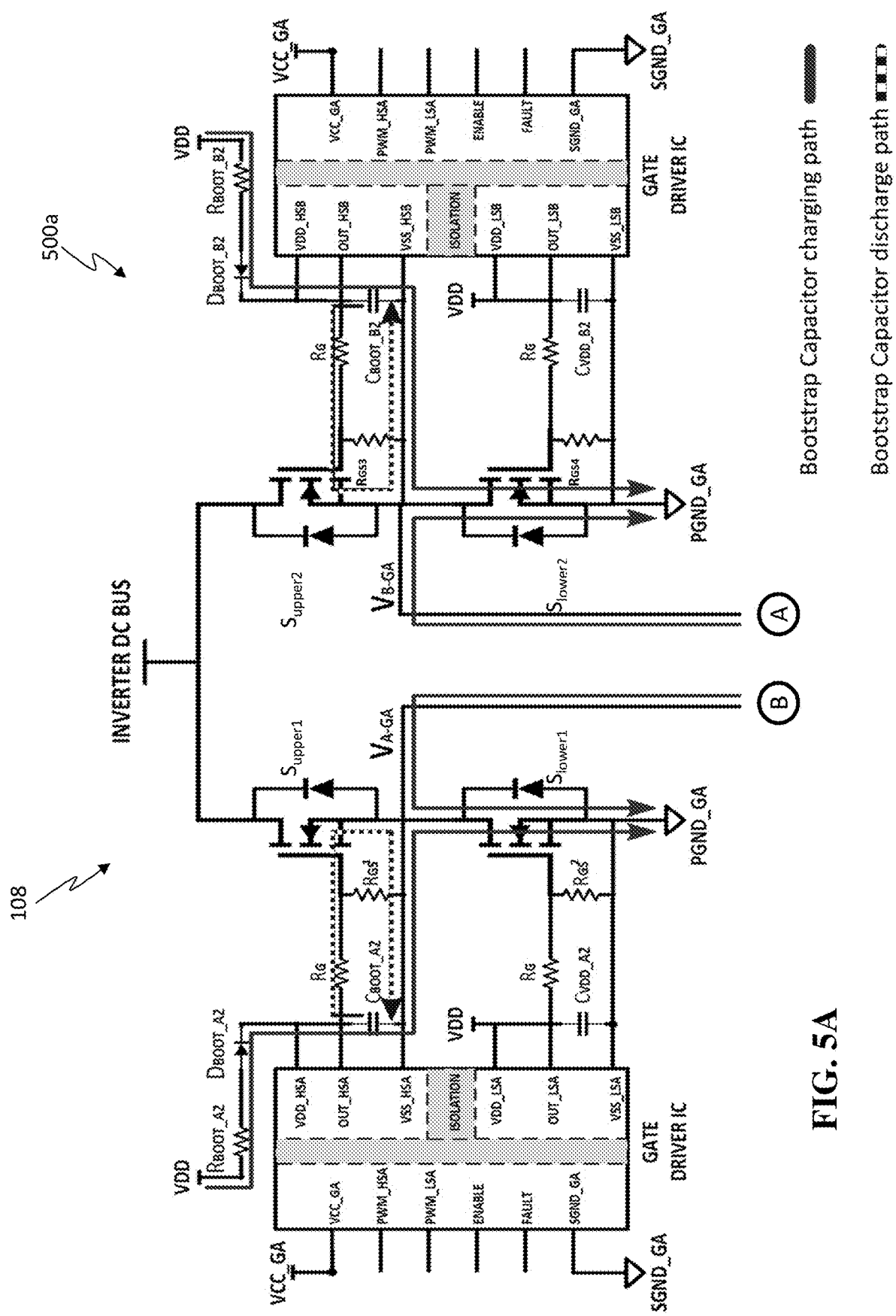
FIGS. 5A-5B are schematics of portions of an exemplary wireless power transmitter including one or more exemplary single-switch tunable reactance circuits, illustrating the transmitter during the charging of the capacitors of the bootstrap-based power supplies.
Figure 5B:
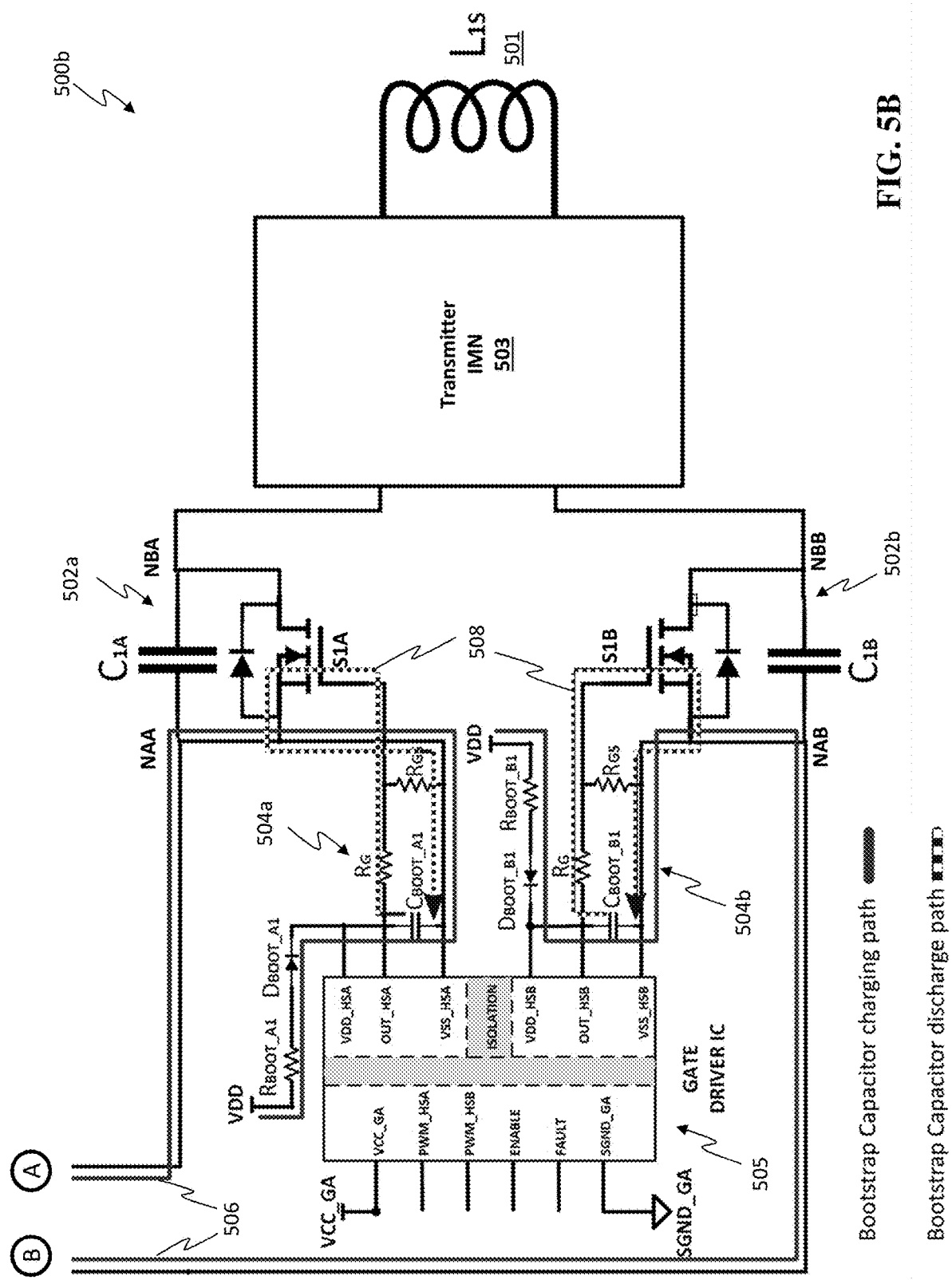

FIGS. 5A-5B are schematics of portions 500a, 500b (collectively referred to as 500) of an exemplary wireless power transmitter including exemplary single-switch tunable reactance circuits 502a, 502b. In the exemplary transmitter portion 500, single-switch tunable reactance circuits 502a, 502b are employed on the upper branch and the lower branch, respectively. In the upper branch, the tunable reactance circuit 502a is coupled between a first output node NAA of the inverter 108 (refer to FIG. 5A) and a first input node NBA of the transmitter IMN 503. In the lower branch, the tunable reactance circuit 502b is coupled between a second output node NAB of the inverter 108 and a second input node NBB of the transmitter IMN 503. The IMN 503 is coupled between the tunable reactance circuits 502a, 502b and transmitter resonator 501. Note that, if the tunable reactance circuits 502a, 502b rely on the bootstrap power supplies 504a, 504b, there cannot be any impedance between the inverter 108 and the tunable reactance circuits 502a, 502b. In some embodiments, the transmitter portion 500 can further include an inductor coupled between the tunable reactance circuit 502a or 502b and the resonator 501.

By utilizing two separate circuits 502a, 502b, the desired reactance is "split" over the two branches, thereby providing a balanced reactance in the transmitter 102. Referring to the above example with $\varphi$ between 90° and 180°, for an individual circuit 200 utilizing a C1=187 nF, the corresponding "split" respective capacitors C1A, C1B in circuits 502a, 502b can each have equal approximately 374 nF, so the total series equivalent capacitance is 187 nF. Note that the upper branch circuit 502a is in series with the lower branch circuit 502b. Referring to the above example with $\varphi$ between 0° and 180°, for an individual circuit 200 utilizing a C1=187 nF, the corresponding "split" respective capacitors C1A, C1B in circuits 502a, 502b can each have equal approximately 187 nF, so the total series equivalent capacitance is 93.5 nF.

The bootstrap power supplies 504a, 504b can drive circuits 502a, 502b, respectively, in the transmitter 102. The bootstrap power supply 504a can include a bootstrap capacitor $C_{BOOT\_A1}$ coupled between node $N_{AA}$ and the output of the bootstrap diode $D_{BOOT\_A1}$. Diode $D_{BOOT\_A1}$ is driven by DC power supply $V_{DD}$. The bootstrap power supply 504b can include a bootstrap capacitor $C_{BOOT\_B1}$ coupled between node $N_{AB}$ and the output of the bootstrap diode $D_{BOOT\_A1}$. Diode $D_{BOOT\_A1}$ is driven by DC power supply $V_{DD}$. Note that supply $V_{DD}$ can refer to one or more DC power supplies. In this example, the bootstrap power supplies 504a, 504b are coupled to a single integrated circuit (IC) 505 for supply by 504a, 504b, and driving the respective gates of switches $S_{1A}$ and $S_{1B}$ (e.g., providing the PWM signals for control). However, in other embodiments, the supplies 504a, 504b may each have separate ICs for control purposes. In various embodiments, the control signal for circuit 502a and the control signal for circuit 502b are synched. This is beneficial for several reasons. The synched control signals enable the capacitance values C1A and C1B to be equal to ensure a balanced network (in the transmitter 500) that minimizes potentials to chassis and/or ground. Further, the synched control signals enable the center of the resonator 501 to be at zero potential with respect to ground, which can be important to reduce or maintain electromagnetic interference (EMI) below a certain threshold. In some embodiments, circuits 502a, 502b can be driven with different control signals that result in different capacitance values C1A and C1B. If the circuits 502a, 502b are controlled by two separate ICs, the two ICs can be connected such that ICs create the same control signal. For instance, this can be accomplished by connecting the two ICs to a master node (e.g., controller, IC, processor, etc.) to receive the synchronized PWM signals.

In various embodiments, the tunable reactance circuits 502a, 502b can operate in one or more modes during the operation of the transmitter 102. For instance, as the inverter 108 ramps up to its desired operation state (e.g., power, particular phase shift, etc.), the circuits 502a, 502b are shorted and therefore present an infinite capacitance with a reactance of zero Ohms. Once the inverter 108 is at its desired phase shift (e.g., maximum phase shift or 180 degrees), then the circuits 502a, 502b can adjust from zero Ohms to some value in between its minimum capacitive reactance –Xtx_min ω (e.g., –5 Ohms for φ of 90° and –10 Ohms for φ of 0°) and its maximum capacitive reactance –Xtx_max Ω (e.g., zero Ohms).

FIGS. 6A-6C illustrate various signals in the transmitter during ramp-up (or "start-up") of transmitter 102. FIG. 6A is a plot of (i) voltage signal $V(S_{lower1}-R_{GS2})$ representing the voltage difference between the gate of first lower switch $S_{lower1}$ and ground PGND_GA; and (ii) voltage signal $V(S_{lower2}-R_{GS4})$ representing the voltage difference between the gate of second lower switch $S_{lower2}$ and ground PGND_GA. The duration 602 in voltage signal $V(S_{lower1}-R_{GS2})$ represents the on-time of switch $S_{lower1}$ and the duration 604 in voltage signal $V(S_{lower2}-R_{GS4})$ represents the on-time of switch $S_{lower2}$. FIG. 6B is a plot of (i) voltage signal $V(C_{BOOT\_A1})$ across capacitor $C_{BOOT\_A1}$ and (ii) voltage signal $V(C_{BOOT\_B1})$ across capacitor $C_{BOOT\_B1}$. Note that the rise in voltage signal $V(C_{BOOT\_A1})$ occurs over the on-time of switch $S_{lower2}$ (duration 604) and the rise in voltage signal $V(C_{BOOT\_A1})$ occurs over the on-time of switch $S_{lower1}$ (duration 602). FIG. 6C is a plot of (i) current signal $I(D_{BOOT\_A1})$ through bootstrap diode $D_{BOOT\_A1}$ and (ii) current signal $I(D_{BOOT\_B1})$ across bootstrap diode $D_{BOOT\_A1}$. Note that the fall in current signal $I(D_{BOOT\_A1})$ occurs over the on-time of switch $S_{lower2}$ (duration 604) and the fall in current signal $I(D_{BOOT\_A1})$ occurs over the on-time of switch $S_{lower1}$ (duration 602).

At steady-state, the circuits 502a, 502b may be continuously, intermittently, or periodically adjusted to attain or maintain a particular power level and/or attain or maintain the inverter phase within a desired range. For example, an increase in the reactance of circuit(s) 502a, 502b may result in increased output power by transmitter 500 and/or reduced inverter VI phase (e.g., difference in phase between the current signal and voltage signal from the inverter 108). Conversely, a decrease in the reactance of circuit(s) 502a, 502b may result in decreased output power by transmitter 500 and/or increased inverter phase. Circuits 502a, 502b can have a particular maximum reactance Xtx_max and minimum reactance Xtx_min based on the characteristics of electronic components used (e.g., C1 capacitance).

FIGS. 7A-7C illustrate various signals in the transmitter during steady-state operation of transmitter 102. FIG. 7A is a plot of (i) voltage signal $V(S_{lower1}-R_{GS2})$; and (ii) voltage signal $V(S_{lower2}-R_{GS4})$, as described above. The duration 702 between $V(S_{lower2}-R_{GS4})$ falling edge and $V(S_{lower1}-R_{GS2})$ rising edge represents the dead-time between switches $S_{upper1}$ and $S_{lower1}$. The duration 704 between $V(S_{lower1}-R_{GS2})$ falling edge and $V(S_{lower2}-R_{GS4})$ rising edge represents the dead-time between switches $S_{upper2}$ and $S_{lower2}$. FIG. 7B is a plot of (i) voltage signal $V(C_{BOOT\_A1})$ and (ii) voltage signal $V(C_{BOOT\_B1})$, as described above. Note that voltage signal $V(C_{BOOT\_A1})$ begins to rise during dead-time 704 and voltage signal $V(C_{BOOT\_B1})$ begins to rise during dead-time 702. FIG. 7C is a plot of (i) current signal $I(D_{BOOT\_A1})$ and (ii) current signal $I(D_{BOOT\_B1})$, as described above. Note that the current signal $I(D_{BOOT\_A1})$ falls during dead-time 704 and the current signal $I(D_{BOOT\_B1})$ falls during dead-time 702.

FIG. 5B further illustrates the transmitter portion 500 during the charging of the bootstrap capacitors $C_{BOOT\_A1}$, $C_{BOOT\_B1}$ of the bootstrap-based power supplies 504a, 504b. As indicated by solid lines 506, the charging of the bootstrap capacitors $C_{BOOT\_A1}$, $C_{BOOT\_B1}$ can occur during the low-side conduction ("on-time") of the low-side switches $S_{lower1}$ and $S_{lower2}$ of the inverter 108. The discharging of the bootstrap capacitors $C_{BOOT\_A1}$, $C_{BOOT\_B1}$ are indicated by the dashed lines 508. As illustrated, the tunable reactance circuits 502a, 502b can rely on the conduction of inverter switches to charge the bootstrap capacitors $C_{BOOT\_A1}$, $C_{BOOT\_B1}$, thereby enabling the inverter gate drive supply to also supply the gate drive for the tunable reactance circuits 502a, 502b.

Figure 8:
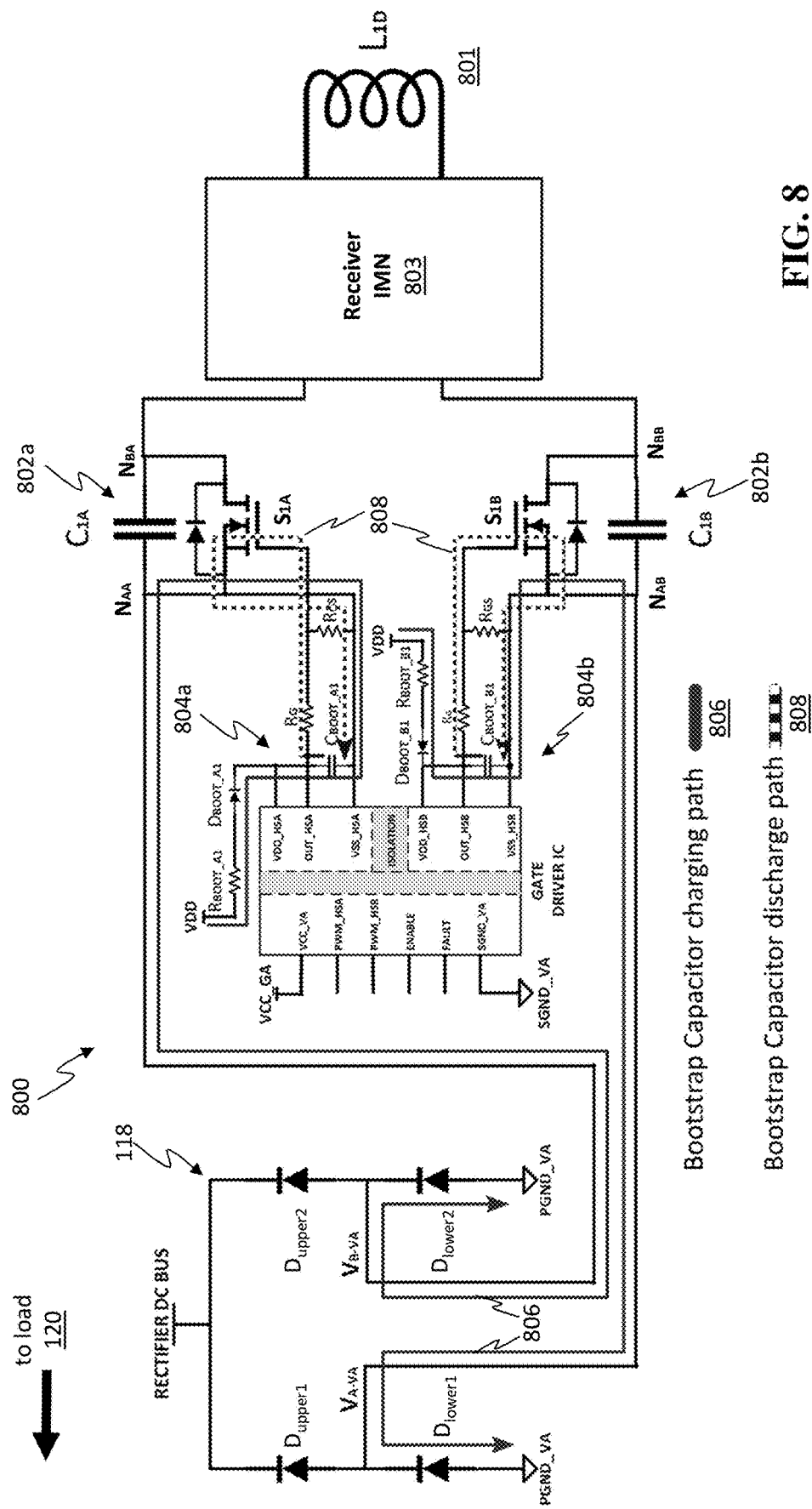
FIG. 8 is a schematic of a portion of an exemplary wireless power receiver including one or more exemplary single-switch tunable reactance circuits.

FIG. 8 is a schematic of a portion 800 of an exemplary wireless power receiver 104 including single-switch tunable reactance circuits 802a, 802b. In the upper branch, the tunable reactance circuit 802a is coupled between a first output node NBA of the receiver IMN 803 and a first input node $N_{AA}$ of the rectifier 118. In the lower branch, the tunable reactance circuit 802b is coupled between a second output node NBB of the receiver IMN 803 and a second input node $N_{AB}$ of the rectifier 118. The IMN 803 is coupled between the tunable reactance circuits 802a, 802b and receiver resonator 801. Note that, if the tunable reactance circuits 802a, 802b rely on the bootstrap power supplies 804a, 804b, there cannot be any impedance between the rectifier 803 and the tunable reactance circuits 802a, 802b.

If the tunable reactance gate driver is powered by a dedicated isolated DC-DC converter, the receiver 800 can include an inductor coupled between the rectifier 118 and the tunable reactance circuit(s) 802a, 802b.

The circuits 802a, 802b can be powered by bootstrap power supplies 804a, 804b as described herein. The bootstrap power supply 804a can include a bootstrap capacitor $C_{BOOT\_A1}$ coupled between node $N_{AA}$ and the output of the bootstrap diode $D_{BOOT\_A1}$. Diode $D_{BOOT\_A1}$ is driven by DC power supply $V_{DD}$. The bootstrap power supply 804b can include a bootstrap capacitor $C_{BOOT\_B1}$ coupled between node $N_{AB}$ and the output of the bootstrap diode $D_{BOOT\_A1}$. Diode $D_{BOOT\_A1}$ is driven by DC power supply $V_{DD}$. Note that supply $V_{DD}$ can refer to one or more DC power supplies. In this example, the bootstrap power supplies 804a, 804b are coupled to a single IC for controlling the supplies 804a, 804b, thereby controlling the respective gates of switches $S_{1A}$ and $S_{1B}$ (e.g., providing the PWM signals for control). However, in other embodiments, the supplies 804a, 804b may each have separate ICs for control purposes. For example, the bootstrap capacitors $C_{BOOT\_A1}$, $C_{BOOT\_B1}$ charge during the low-side conduction of the diodes $D_{lower\_1}$, $D_{lower\_2}$ of rectifier 118.

In various embodiments, the tunable reactance circuits 802a, 802b can operate in one or more modes during the operation of the receiver 104. During initial "power-up" or "ramp-up" (e.g., when power to the load 120 is less than 2 kW), the circuits 802a, 802b are shorted and therefore present an infinite capacitance with reactance of zero Ohms. When the load power reaches 2 kW, then the switches $S_{1A}$, $S_{1B}$ of the circuits 802a, 802b transition from closed to open (e.g., from a reactance of zero (0) Ω to a minimum reactance of −Xrx_min Ω). Next, the controller (e.g., controller 122) can increase the phase delay φ gradually from −Xrx_min Ω until desired power and/or efficiency is attained. Note that circuits 802a, 802b can have a particular maximum reactance −Xrx_max and minimum reactance −Xrx_min based on the characteristics of electronic components used (e.g., C1 capacitance).

Derivation of the Equivalent Capacitance for the Single-Switch Tunable Reactance Circuit In various embodiments, the derivation of the equivalent capacitance $C_{eq}$ for the exemplary single-switch tunable reactance circuit is as follows:

$$I_{TMN} = I_m \cos(\omega t)$$

$$U_{TMN} = \frac{1}{C_1} \int_{\theta_1}^{\theta_2} I_m \cos(\omega t) \, d\omega t = \frac{I_m}{C_1 \omega}[\sin(\omega t) - \sin(\theta_1)]$$

$$\theta_2 = 2\pi - \theta_1$$

Fourier series for the tunable reactance circuit 200 voltage (fundamental frequency):

$$U_{TMN} = a_1 \cos(\omega t) + b_1 \sin(\omega t)$$

$$a_1 = \frac{2}{2\pi} \int_{\theta_1}^{\theta_2} U_{TMN} \cos(\omega t) \, d\omega t =$$

$$\dots = \frac{I_m}{\pi \omega C_1} \int_{\theta_1}^{2\pi - \theta_1} \frac{\sin(2\omega t)}{2} - \sin(\theta_1)\cos(\omega t) \, d\omega t = \dots = 0$$

$$b_1 = \frac{2}{2\pi} \int_{\theta_1}^{\theta_2} U_{TMN} \sin(\omega t) \, d\omega t =$$

$$\frac{2}{2\pi} \int_{\theta_1}^{2\pi - \theta_1} \frac{I_m}{\omega C_1} (\sin^2(\omega t) - \sin(\theta_1)\sin(\omega t)) d\omega t =$$

$$\frac{I_m}{\pi \omega C_1} \int_{\theta_1}^{2\pi - \theta_1} \left[\frac{1}{2} - \frac{1}{2}\cos(2\omega t) - \sin(\theta_1)\sin(\omega t)\right] d\omega t =$$

$$\dots = \frac{I_m}{\pi \omega C_1}\left[\pi - \theta_1 + \frac{1}{2}\sin(2\theta_1)\right]$$

Thus, equivalent capacitance $C_{eq}$ is as follows:

$$\frac{2C_1}{2 - [2\theta_1 - \sin(2\theta_1)]/\pi}$$

Additional Embodiments of the Tunable Reactance Circuit

Figure 9:
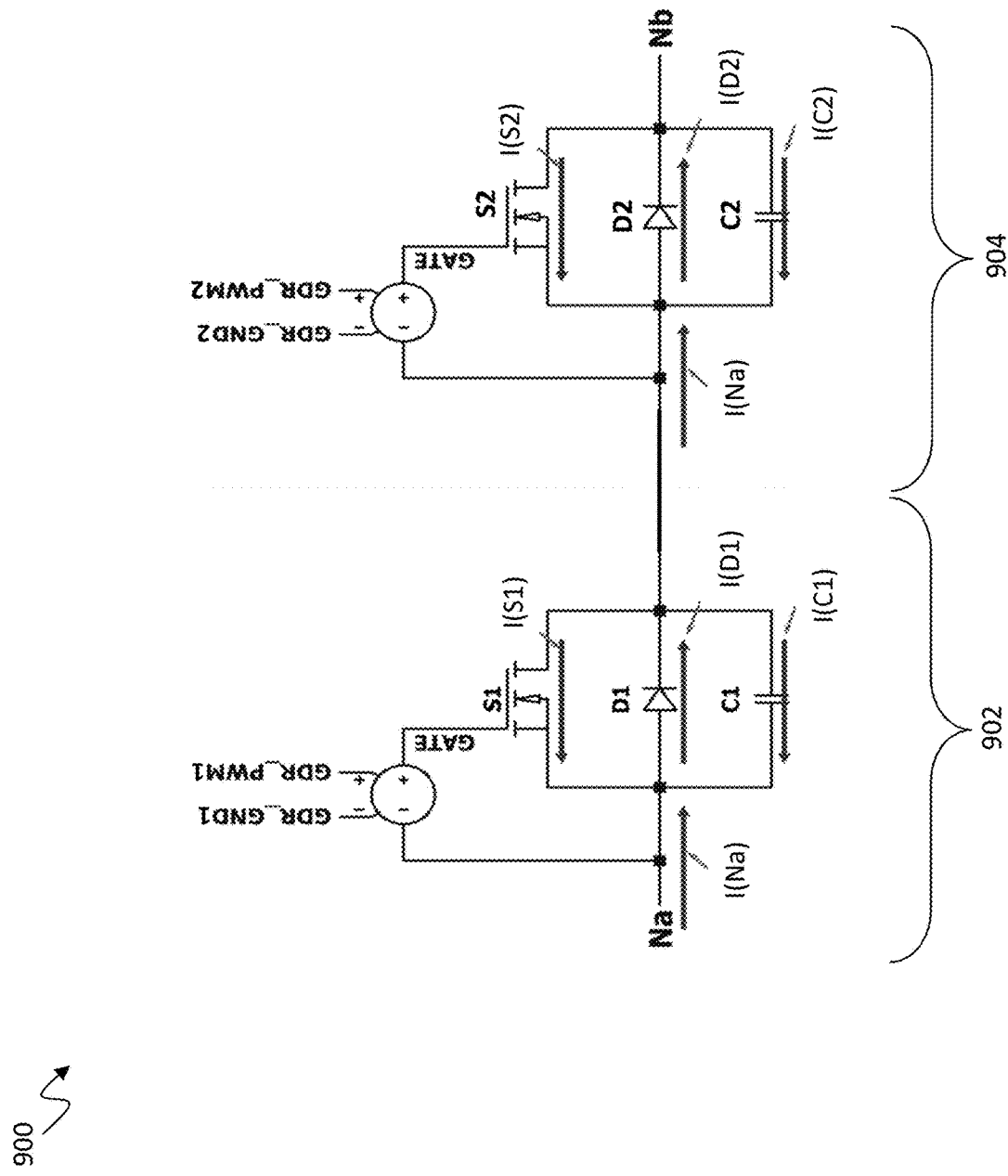
FIG. 9 is a schematic of an embodiment of a tunable reactance circuit.

FIG. 9 illustrates an embodiment of a tunable reactance circuit 900 that includes a first tunable reactance circuit 902 coupled in series with a second tunable reactance 904. Each of circuits 902, 904 can include the tunable reactance circuit 200. In some cases, the example reactance circuit 900 may enable a greater impedance range (e.g., a greater reactance range) than a single tunable reactance circuit 200. In this way, a system (e.g., a wireless power system with a given set of inverter and rectifier limitations) employing the reactance circuit 900 can adapt and/or respond to a wider range of reflected impedances observed by the system due to a wider range of coupling from a larger variation in receiver position (relative to the transmitter position). For example, a wireless power transmitter 102 having the tunable reactance circuit 900 may transmit higher levels of power over a given range of receiver position and/or operate with greater efficiency than a transmitter having no tunable reactance circuit. In another example, a wireless power transmitter 102 having the tunable reactance circuit 900 may transmit higher levels of power over a given range of receiver position and/or operate with greater efficiency than a transmitter having tunable reactance circuit 200.

The above concept is further illustrated in the tables of FIGS. 10A-10B. For instance, in FIG. 10A, example transmitter 1002 may not have a tunable reactance circuit (e.g., 200 or 900). Instead, in some cases, in its place, the transmitter 1002 may have a component with a fixed reactance X1 (e.g., an inductor or a capacitor). In other cases, there may be no such component (in which case the reactance is zero). Example transmitter 1004 may have a tunable reactance circuit 200 over a reactance range of X2-X3. Example transmitter 1006 may have a tunable reactance circuit 900 over a reactance range of X4-X5, which is twice as large as X2-X3, assuming the same switching component as tunable reactance circuit 200 is used in circuit 900. Note that, as tunable reactance circuits 200 are added in series (e.g., 3 circuits, 4 circuits, 5 circuits, and so on in series), the reactance range increases proportionally (e.g., 3 times, 4 times, 5 times, and so on the reactance of a single tunable reactance circuit 200).

In the examples provided in FIG. 10A, the impedance ranges fall within one another, e.g., reactance range X1-X2 falls within reactance range X3-X4. In some embodiments, the "nested" reactance ranges may have the same mean value. In some embodiments, the reactance ranges may have different means. Referring to FIG. 10B, in some cases, reactance ranges may partially overlap. For example, reactance range X1-X2 of transmitter 1008 may partially overlap reactance range X3-X4 and/or reactance range X3-X4 may partially overlap reactance range X5-X6. Note that, though the examples in FIGS. 10A-10B are provided for wireless power transmitters, the same or similar concepts are applicable to wireless power receivers.

In some embodiments, a wireless power transmitter 102 employing the tunable reactance circuit 900 may utilize a dedicated isolated DC-DC converter separate from the bootstrap supply described above (e.g., a bootstrap capacitor configured to charge during conduction of a portion of the inverter 108) of the transmitter 102. Note that, if the tunable reactance gate driver is powered by dedicated isolated DC-DC converter, the transmitter can further include an inductor coupled between the driving circuit and the tunable reactance circuit.

Figure 11:
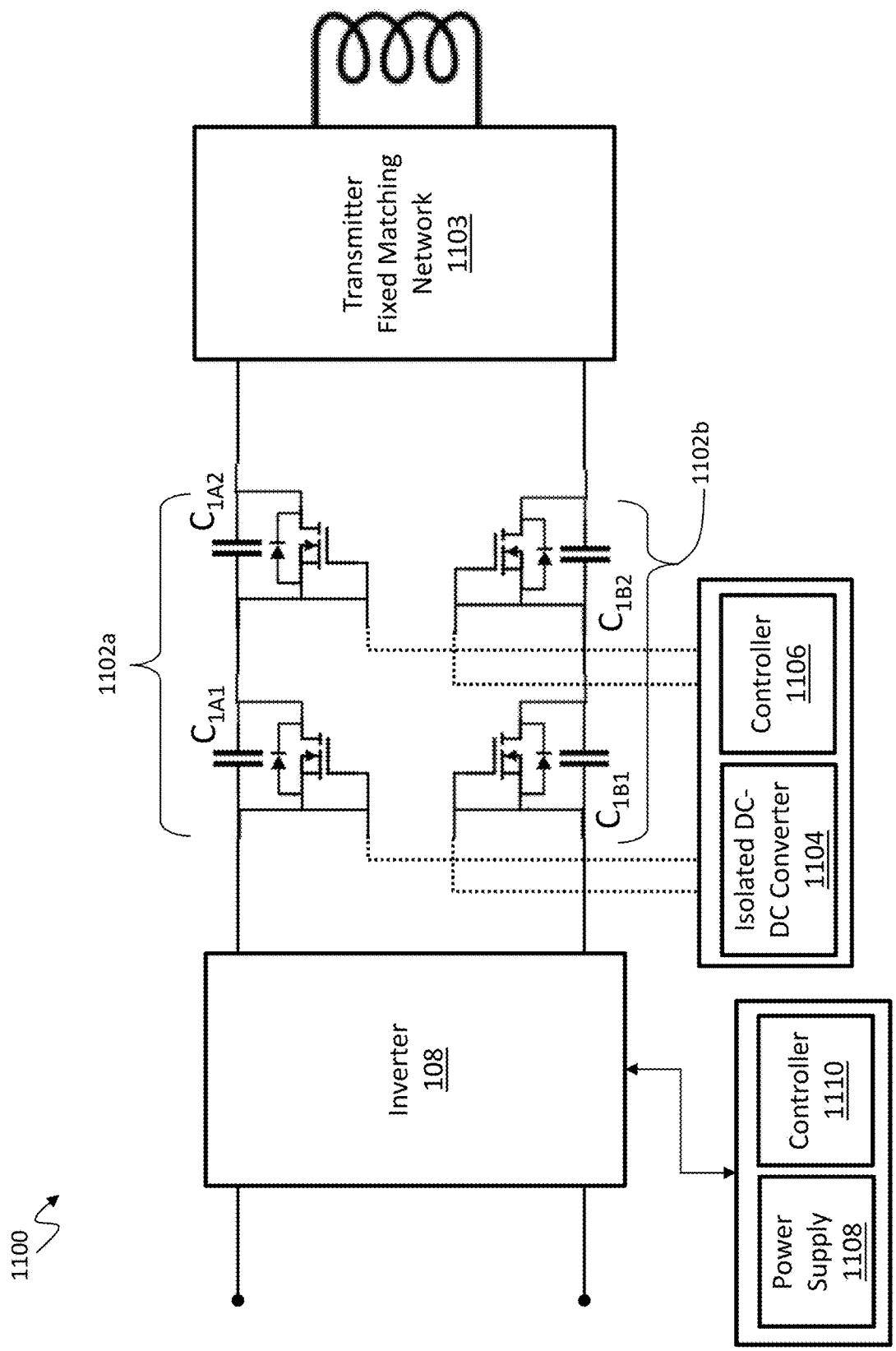
FIG. 11 is a schematic of a portion of a transmitter including the tunable reactance circuit of FIG. 9.

FIG. 11 is a schematic of a portion 1100 of a wireless power transmitter that includes tunable reactance circuits 1102a, 1102b (collectively referred to as circuits 1102). In the exemplary transmitter portion 1100, single-switch tunable reactance circuit 1102a, 1102b are employed on the upper branch and the lower branch, respectively. The circuits 1102a, 1102b are coupled between the inverter 108 and the fixed matching network 1103. By utilizing two separate circuits 1102a, 1102b, the desired reactance is "split" over the two branches, thereby providing a balanced reactance in the transmitter. Referring to the example of an individual circuit 200 utilizing a C1=187 nF and phase angle φ between 90° and 180°, the corresponding "split" respective capacitors (1) C1A1, C1A2 (together 1102a) has a total capacitance value of approximately 187 nF and (2) C1B1, C1B2 (together 1102b) has a total capacitance value of approximately 187 nF, so the total series equivalent capacitance is 93.5 nF. Referring to the example of an individual circuit 200 utilizing a C1=187 nF and phase angle φ between 0° and 180°, the corresponding "split" respective capacitors (1) C1A1, C1A2 (together 1102a) has a total capacitance value of approximately 93.5 nF and (2) C1B1, C1B2 (together 1102b) has a total capacitance value of approximately 93.5 nF, so the total series equivalent capacitance is 46.75 nF.

The circuits 1102a, 1102b can be powered by a separate dedicated isolated DC-DC converter 1104. In some embodiments, the circuits 1102a, 1102b can be controlled by controller 1106. The controller 1106 may be part of or the same as controller 122. The inverter 108 can be powered by a separate power supply 1108 and controlled by a separate controller 1110. Note that controllers 1106 and 1110 may be packaged together, may be connected to each other, and/or may be part of the same controller (e.g., 122).

Figure 12:
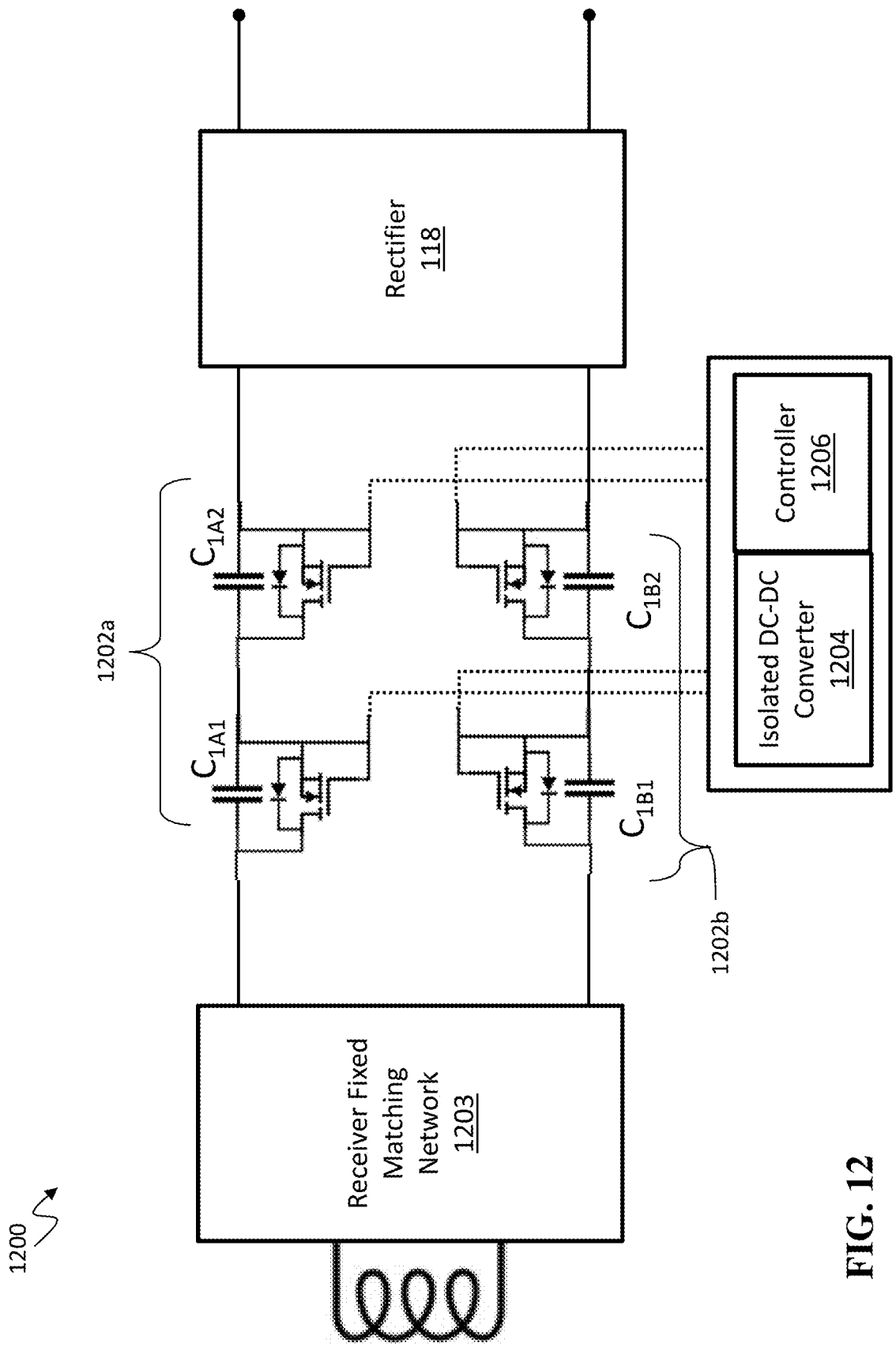
FIG. 12 is a schematic of a portion of a receiver including the tunable reactance circuit of FIG. 9.

In some embodiments, a wireless power receiver 104 employing the tunable reactance circuit 900 may utilize an isolated DC-DC converter separate from the bootstrap supply described above (e.g., a bootstrap capacitor configured to charge during conduction of a portion of the rectifier 118). FIG. 12 is a schematic of a portion 1200 of a wireless power receiver that includes tunable reactance circuits 1202a, 1202b (collectively referred to as circuits 1202). In the exemplary receiver portion 1200, single-switch tunable reactance circuits 1202a and 1202b are employed on the upper branch and the lower branch, respectively. The circuits 1202a, 1202b are coupled between the fixed matching network 1203 and rectifier 118. By utilizing two separate circuits 1202a, 1202b, the desired reactance is "split" over the two branches, thereby providing a balanced reactance in the receiver. Referring to the example of an individual circuit 200 utilizing a C1=135 nF and phase angle φ between 90° and 180°, the corresponding "split" respective capacitors (1) C1A1, C1A2 (together 1202a) has a total capacitance value of approximately 135 nF and (2) C1B1, C1B2 (together 1202b) has a total capacitance value of approximately 135 nF, so the total series equivalent capacitance is 67.5 nF. Referring to the example of an individual circuit 200 utilizing a C1=135 nF and phase angle φ between 0° and 180°, the corresponding "split" respective capacitors (1) C1A1, C1A2 (together 1202a) has a total capacitance value of approximately 67.5 nF and (2) C1B1, C1B2 (together 1202b) has a total capacitance value of approximately 67.5 nF, so the total series equivalent capacitance 33.75 nF.

Figure 13:
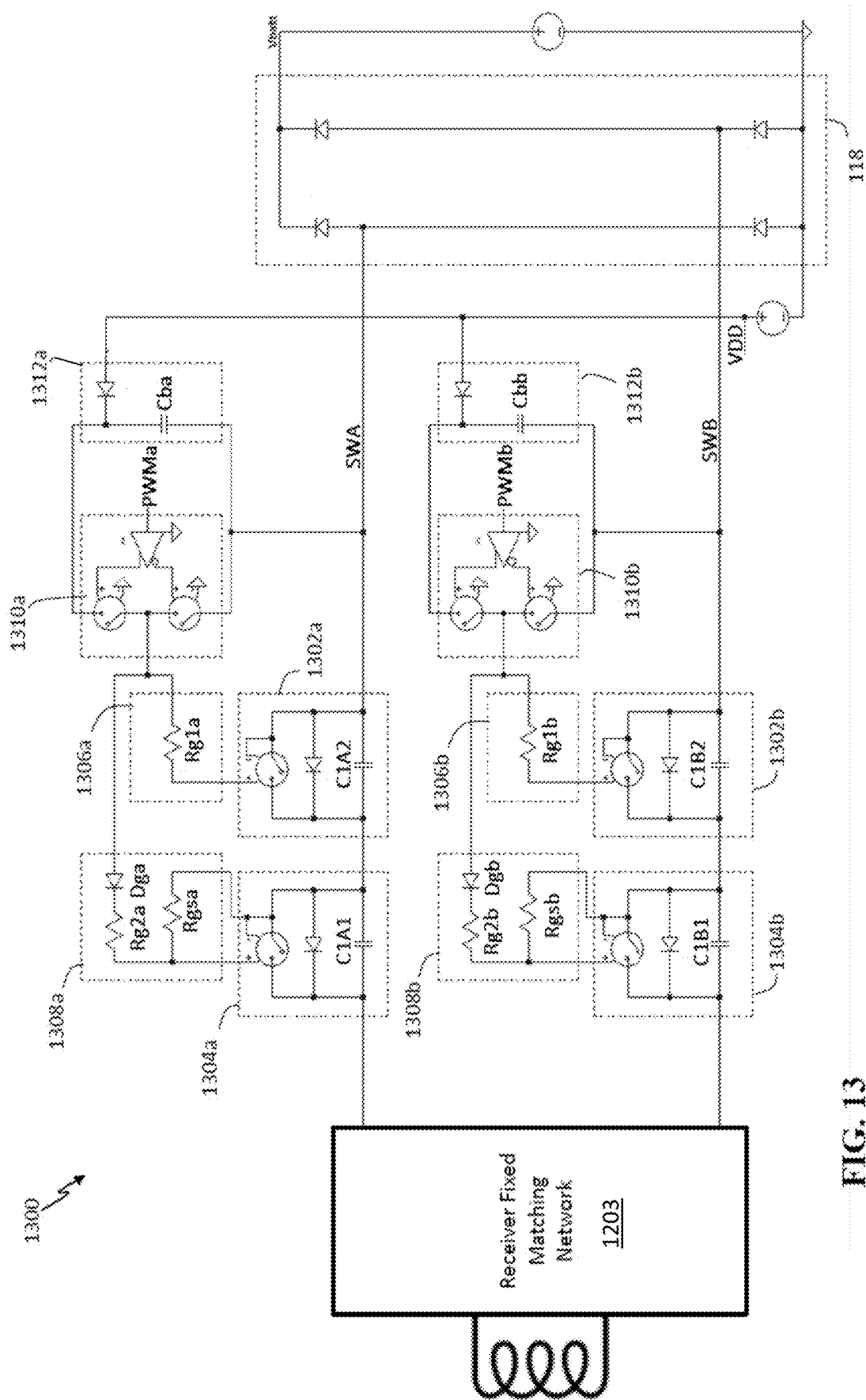
FIG. 13 is a schematic of a portion of a receiver including the tunable reactance circuit of FIG. 9.

FIG. 13 is a schematic of a wireless power receiver portion 1300 including the tunable reactance circuits 900. In particular, on the upper branch, receiver portion 1300 includes a first tunable reactance subcircuit 1302a and second tunable reactance subcircuit 1304a. The switch of subcircuit 1302a is coupled to a gate resistor 1306a. The switch of subcircuit 1304b is coupled to a gate circuit 1308a, which includes a high-voltage decoupling diode Dga, a gate resistor Rg2a, and a pull-down resistor Rgsa. The inputs of resistor 1306a and gate circuit 1308a are connected to the output of level-shifting gate drivers 1310a, which is powered by the bootstrap circuit 1312a. The bootstrap circuit 1312a is coupled to the input of the rectifier 118.

In the lower branch, the receiver portion 1300 includes a first tunable reactance subcircuit 1302b and a second tunable reactance subcircuit 1304b. The switch of subcircuit 1302b is coupled to a gate resistor 1306b. The switch of subcircuit 1304b is coupled to a gate circuit 1308b, which includes a high-voltage decoupling diode Dgb, a gate resistor Rg2b, and a pull-down resistor Rgsb. The inputs of resistor 1306b and gate circuit 1308b are connected to the output of shifting gate drivers 1310b, which is powered by the bootstrap circuit 1312a. The bootstrap circuit 1312a is coupled to the input of the rectifier 118.

FIGS. 14A-14D illustrate the various signals in receiver portion 1300. Referring to FIG. 14A, in the gate circuits 1308a, 1308b, the high-voltage decoupling diode voltage 1402 blocks the voltage across the first tunable reactance subcircuits 1302a, 1302b, respectively. In FIG. 14B, the high-voltage decoupling diode current 1404 has an initial peak 1406 to charge the FET capacitance and then, during a time 1408 after the peak 1406, is equal to the gate drive voltage divided by the gate resistor plus the pull-down resistor during the on-time. The respective bootstrap capacitor Cba of circuit 1312a or bootstrap capacitor Cbb of circuit 1312b is configured to be large enough such that this current does not cause the gate drive voltage to droop. In FIG. 14C, the resulting gate-to-source voltage 1410 of the FET of tunable reactance subcircuit 1308a or 1308b has a fast rise time 1412 and a passive discharge based on the FET gate to source capacitance and the pull-down resistor. In FIG. 14D, the resulting drain-to-source voltage 1414 of the FET of the tunable reactance subcircuit 1308a or 1308b is nearly equal to the drain-to-source voltage of the FET of the tunable reactance subcircuit 1306a or 1306b, effectively doubling the reactance.

FIGS. 15A-15D illustrate the various signals in receiver portion 1300. FIG. 15A illustrates the current I(Na) into the tunable reactance network (e.g., 200, 900, 1302a, 1304a). In FIG. 15B, the drain-to-source voltage 1502 across the FET of tunable reactance subcircuit 1302a or 1302b is the same as the single switch tunable reactance circuit 200. In FIG. 15C, the drain-to-source voltage 1504 of the FET of the tunable reactance subcircuit 1304a or 1304b is nearly equal to the drain-to-source voltage of the FET of the tunable reactance subcircuit 1302a or 1302b, respectively. Referring to FIG. 15D, the resulting total series voltage across each branch of the series tunable reactance subcircuits 1302a and 1304a (or 1302b and 1304b) is nearly double the single switch tunable reactance implementation 200, effectively doubling the reactance.

Figure 16A:
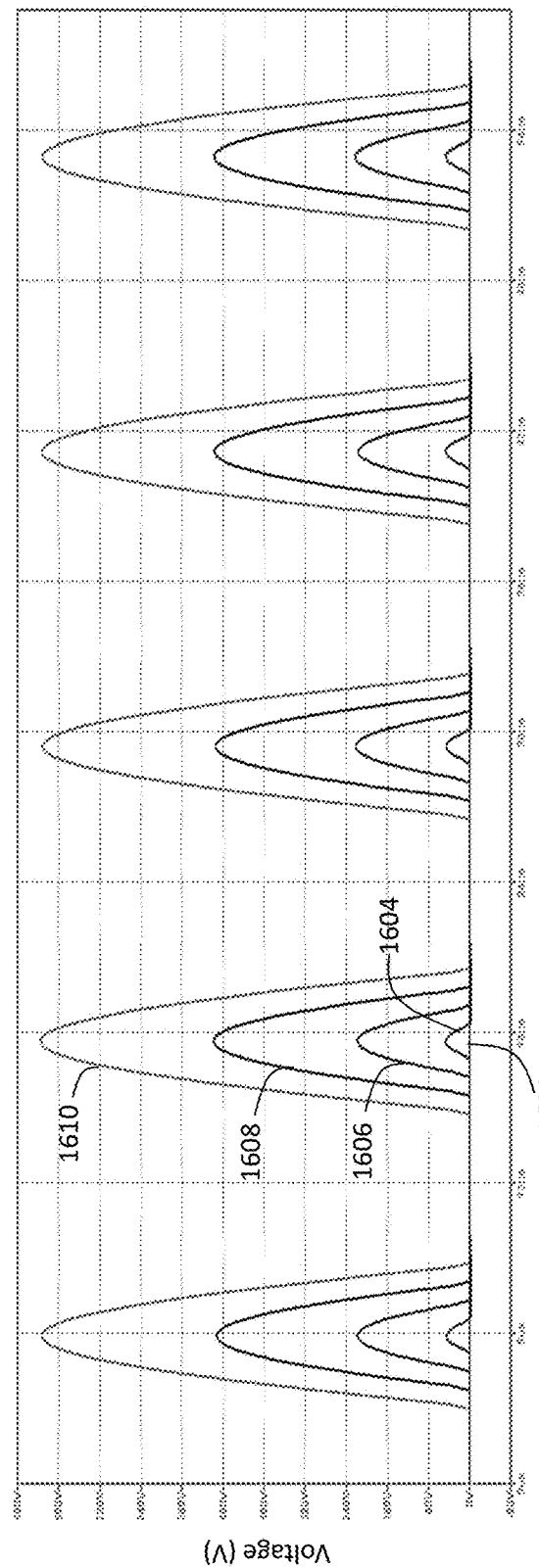
FIGS. 16A-16B are plots of signals as a function of phase angle in the receiver portion of FIG. 13.
Figure 16B:
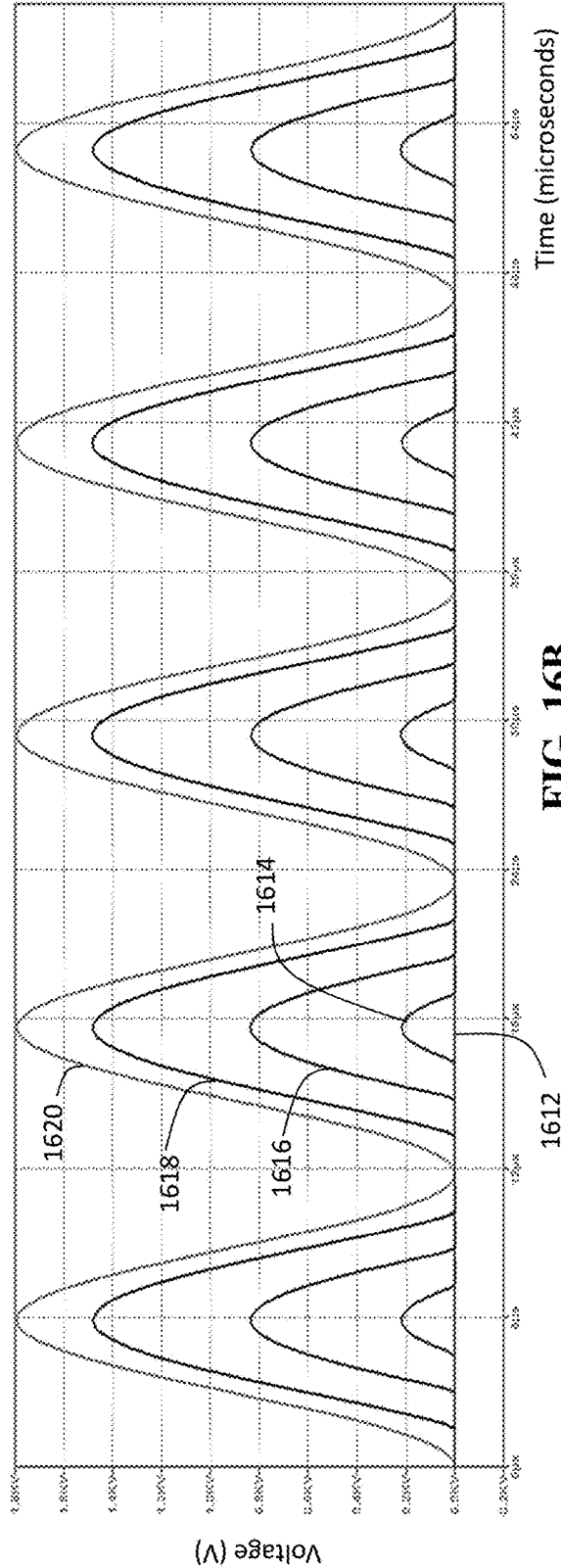

FIG. 16A is a plot of five signals 1602, 1604, 1606, 1608, 1610 representing the total series voltage across each branch of the receiver portion 1300, including the upper branch having the tunable reactance subcircuits 1302a, 1304a and the lower branch having the tunable reactance subcircuits 1302b, 1304b, for five example phase angles φ between 90° and 180°. The five different phase angles are provided in Table 1 below. As phase angle φ is increased from 90 to 180, the voltage also increases. FIG. 16B is a plot of five signals representing the total series voltage across each branch of the receiver portion 1300, including the upper branch having the tunable reactance subcircuits 1302a, 1304a and the lower branch having the tunable reactance subcircuits 1302b, 1304b, for five example phase angles φ between 0° and 180°. The five different phase angles are provided in Table 2 below. As phase angle φ is increased from 0 to 180, the voltage also increases.

TABLE 1

Phase angles φ between 90° and 180°
for voltage signals of FIG. 16A.

| Signal Ref. | FIG. 16A-Phase Angle φ |
|---|---|
| 1602 | 180 |
| 1604 | 157.5 |
| 1606 | 135 |
| 1608 | 112.5 |
| 1610 | 90 |

TABLE 2

Phase angles φ between 0° and 180°
for voltage signals of FIG. 16B.

| Signal Ref. | FIG. 16B-Phase Angle φ |
|---|---|
| 1612 | 180 |
| 1614 | 135 |
| 1616 | 90 |
| 1618 | 45 |
| 1620 | 0 |

Hardware and Software Implementations

Figure 17:
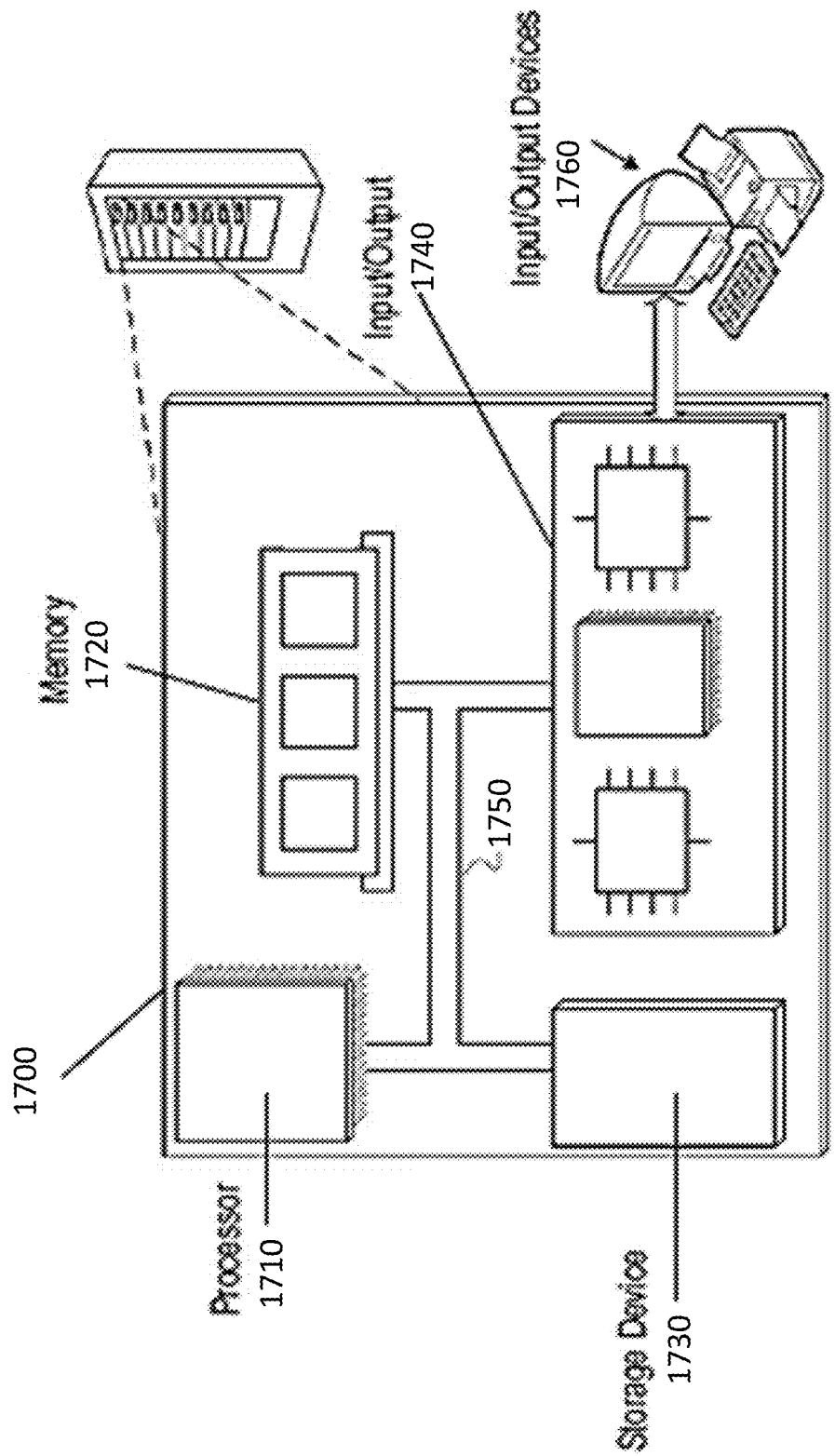
FIG. 17 is a block diagram of an example computer system that may be used in implementing the systems and methods described herein.

FIG. 17 is a block diagram of an example computer system 1700 that may be used in implementing the systems and methods described herein. General-purpose computers, network appliances, mobile devices, or other electronic systems may also include at least portions of the system 1700. The system 1700 includes a processor 1710, a memory 1720, a storage device 1730, and an input/output device 1740. Each of the components 1710, 1720, 1730, and 1740 may be interconnected, for example, using a system bus 1750. The processor 1710 is capable of processing instructions for execution within the system 1700. In some implementations, the processor 1710 is a single-threaded processor. In some implementations, the processor 1710 is a multi-threaded processor. The processor 1710 is capable of processing instructions stored in the memory 1720 or on the storage device 1730.

The memory 1720 stores information within the system 1700. In some implementations, the memory 1720 is a non-transitory computer-readable medium. In some implementations, the memory 1720 is a volatile memory unit. In some implementations, the memory 1720 is a nonvolatile memory unit. In some examples, some or all of the data described above can be stored on a personal computing device, in data storage hosted on one or more centralized computing devices, or via cloud-based storage. In some examples, some data are stored in one location and other data are stored in another location. In some examples, quantum computing can be used. In some examples, functional programming languages can be used. In some examples, electrical memory, such as flash-based memory, can be used.

The storage device 1730 is capable of providing mass storage for the system 1700. In some implementations, the storage device 1730 is a non-transitory computer-readable medium. In various different implementations, the storage device 1730 may include, for example, a hard disk device, an optical disk device, a solid-date drive, a flash drive, or some other large capacity storage device. For example, the storage device may store long-term data (e.g., database data, file system data, etc.). The input/output device 1740 provides input/output operations for the system 1700. In some implementations, the input/output device 1740 may include one or more of a network interface devices, e.g., an Ethernet card, a serial communication device, e.g., an RS-232 port, and/or a wireless interface device, e.g., an 802.11 card, a 3G wireless modem, or a 4G wireless modem. In some implementations, the input/output device may include driver devices configured to receive input data and send output data to other input/output devices, e.g., keyboard, printer and display devices 1760. In some examples, mobile computing devices, mobile communication devices, and other devices may be used.

In some implementations, at least a portion of the approaches described above may be realized by instructions that upon execution cause one or more processing devices to carry out the processes and functions described above. Such instructions may include, for example, interpreted instructions such as script instructions, or executable code, or other instructions stored in a non-transitory computer readable medium. The storage device 1730 may be implemented in a distributed way over a network, such as a server farm or a set of widely distributed servers, or may be implemented in a single computing device.

Although an example processing system has been described in FIG. 17, embodiments of the subject matter, functional operations and processes described in this specification can be implemented in other types of digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible nonvolatile program carrier for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "system" may encompass all kinds of apparatus, devices, and machines for processing data, including by way of example a programmable processor, a computer, or multiple processors or computers. A processing system may include special purpose logic circuitry, e.g., an FPGA (field programmable gate array) or an ASIC (application specific integrated circuit). A processing system may include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a standalone program or as a module, component, subroutine, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program can include, by way of example, general or special purpose microprocessors or both, or any other kind of central processing unit. Generally, a central processing unit will receive instructions and data from a read-only memory or a random access memory or both. A computer generally includes a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD-ROM and DVD-ROM disks. The processor and the memory can be supplemented by, or incorporated in, special purpose logic circuitry.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single product or packaged into multiple products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous. Other steps or stages may be provided, or steps or stages may be eliminated, from the described processes. Accordingly, other implementations are within the scope of the following claims.

Terminology

The phraseology and terminology used herein is for the purpose of description and should not be regarded as limiting.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

What is claimed is:

1. A system comprising:
at least one tunable reactance circuit configured to present a continuously or discretely tunable capacitive reactance between a first capacitive reactance and a second capacitive reactance when energized, each circuit comprising:
a switch configured to be controlled by a gate driver, the gate driver configured to receive a control signal indicating an on-time of the switch;
a diode coupled antiparallel to the switch; and
one or more capacitors coupled in parallel to the diode,
wherein the tunable capacitive reactance is based on the on-time of the switch and a total capacitance value of the one or more capacitors.

2. The system of claim 1 wherein a capacitance value $C_{eq}$ of the tunable reactance circuit is defined by:

$$C_{eq} = C_{total} \cdot \frac{2}{2 - (2\varphi - \sin 2\varphi)/\pi}$$

wherein $C_{total}$ is the total capacitance value and $\varphi$ is a phase angle (i) between 90° and 180° or (ii) between 0° and 180°, and wherein the on-time of the switch is based on the phase angle.

3. The system of claim 1 wherein the switch is a MOSFET and the diode is a body diode of the MOSFET.

4. The system of claim 1 further comprising:
a driving circuit configured to output a driving signal at an operating frequency, the driving circuit having a first output node coupled to an input of the tunable reactance circuit; and
a resonator configured to generate an electromagnetic field based on the driving signal, the resonator having a first input node coupled to an output of the tunable reactance circuit.

5. The system of claim 4 wherein the gate driver is coupled to a bootstrap power supply, the bootstrap power supply comprising a bootstrap capacitor configured to charge during conduction of at least a portion of the driving circuit.

6. The system of claim 4 wherein the driving circuit is an inverter, and the system further comprises:
an auxiliary power source configured to energize one or more gate drivers of the inverter and the gate driver of the tunable reactance circuit.

7. The system of claim 6 wherein the auxiliary power source is an isolated DC-DC converter.

8. The system of claim 4 wherein the tunable capacitive reactance is based on a reflected impedance in the system.

9. The system of claim 4 wherein the tunable capacitive reactance is based on a power characteristic of the system.

10. The system of claim 4 wherein the at least one tunable reactance circuit comprises a first tunable reactance circuit and a second tunable reactance circuit, and
wherein the driving circuit has a second output node coupled to an input of the second tunable reactance circuit and the resonator has a second input node coupled to an output of the second tunable reactance circuit.

11. The system of claim 10 wherein a capacitance value of the first tunable reactance circuit is equal to a capacitance value of the second tunable reactance circuit.

12. The system of claim 1 further comprising:
a resonator having a first output node coupled to an input of the tunable reactance circuit; and
a rectifier having a first input node coupled to an output of the tunable reactance circuit.

13. The system of claim 12 wherein the gate driver is coupled to a bootstrap power supply, the bootstrap power supply comprising a bootstrap capacitor configured to charge during conduction of at least a portion of the rectifier.

14. The system of claim 12 further comprising:
an auxiliary power source configured to energize the gate driver of the tunable reactance circuit.

15. The system of claim 14 wherein the auxiliary power source is an isolated DC-DC converter.

16. The system of claim 12 wherein the tunable capacitive reactance is based on a reflected impedance in the system.

17. The system of claim 12 wherein the tunable capacitive reactance is based on a power characteristic of the system.

18. The system of claim 12 wherein the at least one tunable reactance circuit comprises a first tunable reactance circuit and a second tunable reactance circuit, and
wherein the resonator has a second output node coupled to an input of the second tunable reactance circuit and the rectifier has a second input node coupled to an output of the second tunable reactance circuit.

19. The system of claim 12 wherein a capacitance value of the first tunable reactance circuit is equal to a capacitance value of the second tunable reactance circuit.

20. A system comprising:
at least one tunable reactance circuit configured to present a tunable capacitive reactance when energized, each circuit comprising:
a switch configured to be controlled by a gate driver, the gate driver configured to receive a control signal indicating an on-time of the switch;
a diode coupled antiparallel to the switch; and
one or more capacitors coupled in parallel to the diode,
wherein the tunable capacitive reactance is based on the on-time of the switch and a total capacitance value of the one or more capacitors, and
a capacitance value $C_{eq}$ of the tunable reactance circuit is defined by:

$$C_{eq} = C_{total} \cdot \frac{2}{2 - (2\varphi - \sin 2\varphi)/\pi}$$

wherein $C_{total}$ is the total capacitance value and $\varphi$ is a phase angle (i) between 90° and 180° or (ii) between 0° and 180°, the on-time of the switch being based on the phase angle.

21. A system comprising:
at least one tunable reactance circuit configured to present a tunable capacitive reactance when energized, each circuit comprising:
a switch configured to be controlled by a gate driver, the gate driver configured to receive a control signal indicating an on-time of the switch;
a diode coupled antiparallel to the switch;
one or more capacitors coupled in parallel to the diode;
a driving circuit configured to output a driving signal at an operating frequency, the driving circuit having a first output node coupled to an input of the tunable reactance circuit; and
a resonator configured to generate an electromagnetic field based on the driving signal, the resonator having a first input node coupled to an output of the tunable reactance circuit,
wherein the tunable capacitive reactance is based on the on-time of the switch and a total capacitance value of the one or more capacitors.

22. A system comprising:
at least one tunable reactance circuit configured to present a tunable capacitive reactance when energized, each circuit comprising:
a switch configured to be controlled by a gate driver, the gate driver configured to receive a control signal indicating an on-time of the switch;
a diode coupled antiparallel to the switch;
one or more capacitors coupled in parallel to the diode;
a resonator having a first output node coupled to an input of the tunable reactance circuit; and
a rectifier having a first input node coupled to an output of the tunable reactance circuit,
wherein the tunable capacitive reactance is based on the on-time of the switch and a total capacitance value of the one or more capacitors.

* * * * *